US010812053B2

United States Patent
Hayashi et al.

(10) Patent No.: US 10,812,053 B2
(45) Date of Patent: Oct. 20, 2020

(54) TRANSMISSION DEVICE AND COMMUNICATION SYSTEM

(71) Applicant: Sony Corporation, Tokyo (JP)

(72) Inventors: Hiroaki Hayashi, Kanagawa (JP); Tomohiro Namise, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 16/094,359

(22) PCT Filed: May 18, 2017

(86) PCT No.: PCT/JP2017/018658
§ 371 (c)(1),
(2) Date: Oct. 17, 2018

(87) PCT Pub. No.: WO2017/208841
PCT Pub. Date: Dec. 7, 2017

(65) Prior Publication Data
US 2019/0123724 A1    Apr. 25, 2019

(30) Foreign Application Priority Data
May 31, 2016 (JP) ................................ 2016-108430

(51) Int. Cl.
*H03K 3/012* (2006.01)
*H04L 25/02* (2006.01)
(Continued)

(52) U.S. Cl.
CPC ............. *H03K 3/012* (2013.01); *H04B 1/16* (2013.01); *H04L 25/0278* (2013.01); *H04B 2001/0416* (2013.01)

(58) Field of Classification Search
CPC .. H03K 3/012; H04B 1/04; H04B 1/16; H04B 2001/0416; H04L 25/0278; H04L 25/028
(Continued)

(56) References Cited

U.S. PATENT DOCUMENTS

| 4,071,705 | A  | * | 1/1978 | Miller, Jr. | ............. | H04J 3/1676 |
|           |    |   |        |             |               | 370/310 |
| 7,239,169 | B2 | * | 7/2007 | Isa | ...................... | H04L 25/0278 |
|           |    |   |        |     |                        | 326/30 |

(Continued)

FOREIGN PATENT DOCUMENTS

JP             06-261092 A       9/1994

*Primary Examiner* — Wednel Cadeau
(74) *Attorney, Agent, or Firm* — Michael Best & Friedrich LLP

(57) ABSTRACT

Provided is a transmission device including: a first transmitter that has a plurality of drivers that each enable transmission of a signal using a plurality of voltages including a first voltage, a second voltage, and a third voltage between the first voltage and the second voltage, and that transmits a sequence of symbols; a second transmitter that has a plurality of drivers that each enable transmission of a signal using the plurality of voltages, and that transmits a sequence of symbols; and a voltage generator that generates the third voltage. Each of the drivers of the first transmitter and the drivers of the second transmitter has a switch that transmits the third voltage generated by the voltage generator to an output terminal of the driver through turn-on operation of the switch.

24 Claims, 25 Drawing Sheets

(51) Int. Cl.
*H04B 1/04* (2006.01)
*H04B 1/16* (2006.01)

(58) Field of Classification Search
USPC .......................................................... 375/259
See application file for complete search history.

(56) References Cited

U.S. PATENT DOCUMENTS

| | | |
|---|---|---|
| 8,064,535 B2 | 11/2011 | Wley |
| 2005/0184756 A1 | 8/2005 | Hohl et al. |
| 2014/0198837 A1* | 7/2014 | Fox ....................... H04L 25/493 |
| | | 375/240 |
| 2015/0066230 A1 | 3/2015 | Ulrich |

* cited by examiner

[Fig. 1]
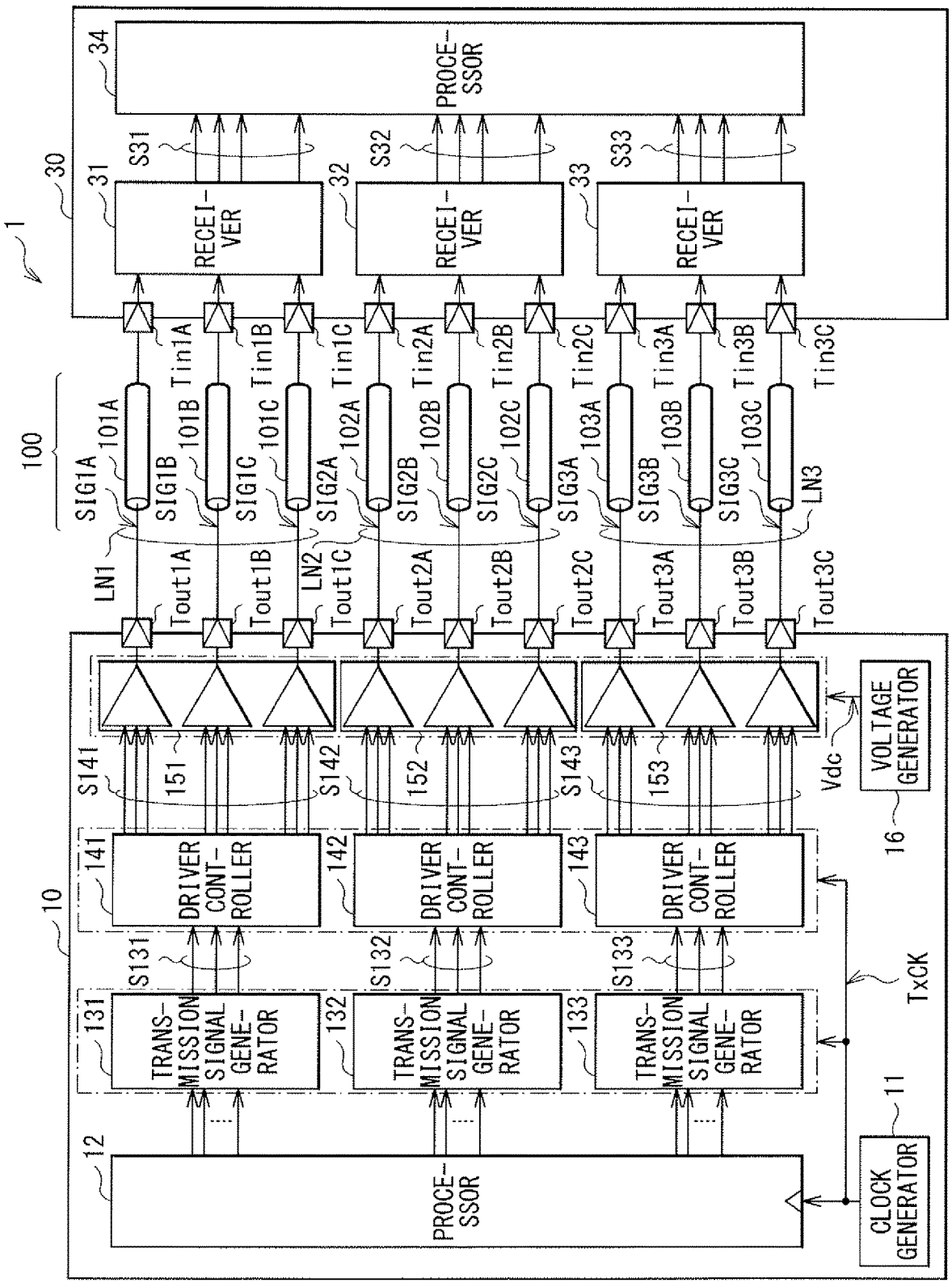

[Fig. 2]
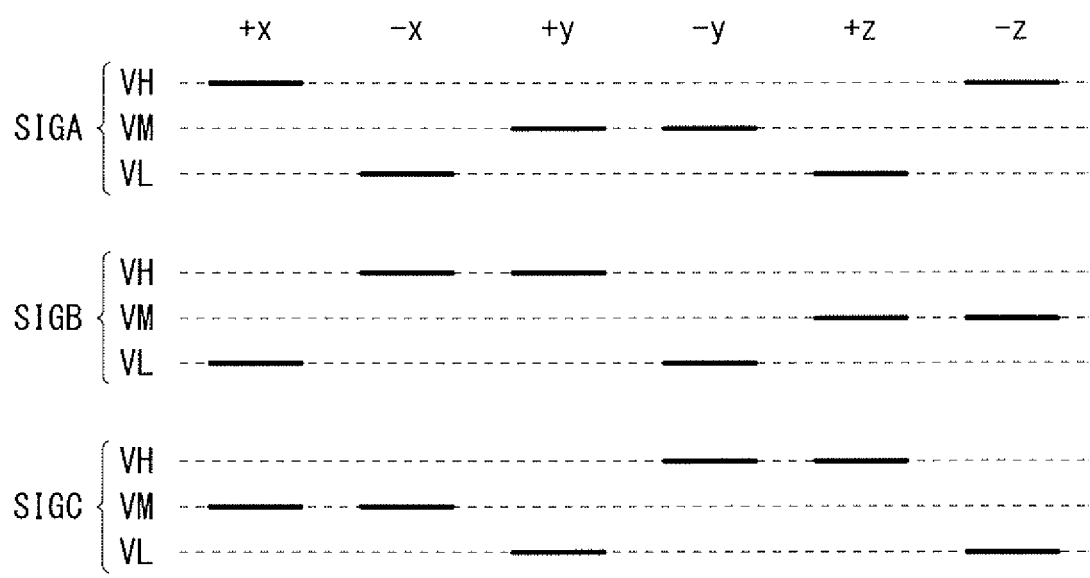

[Fig. 3]
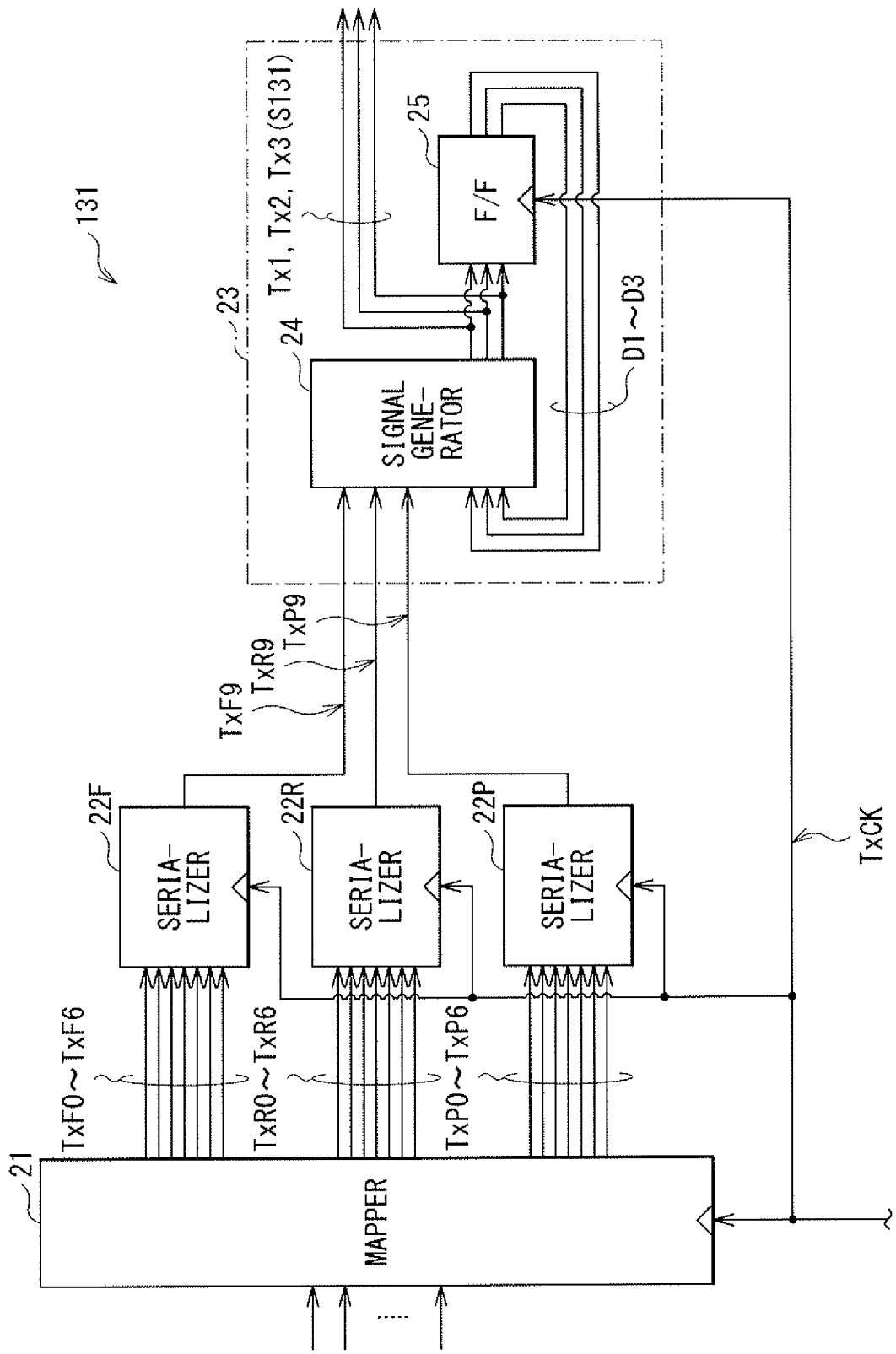

[Fig. 4]
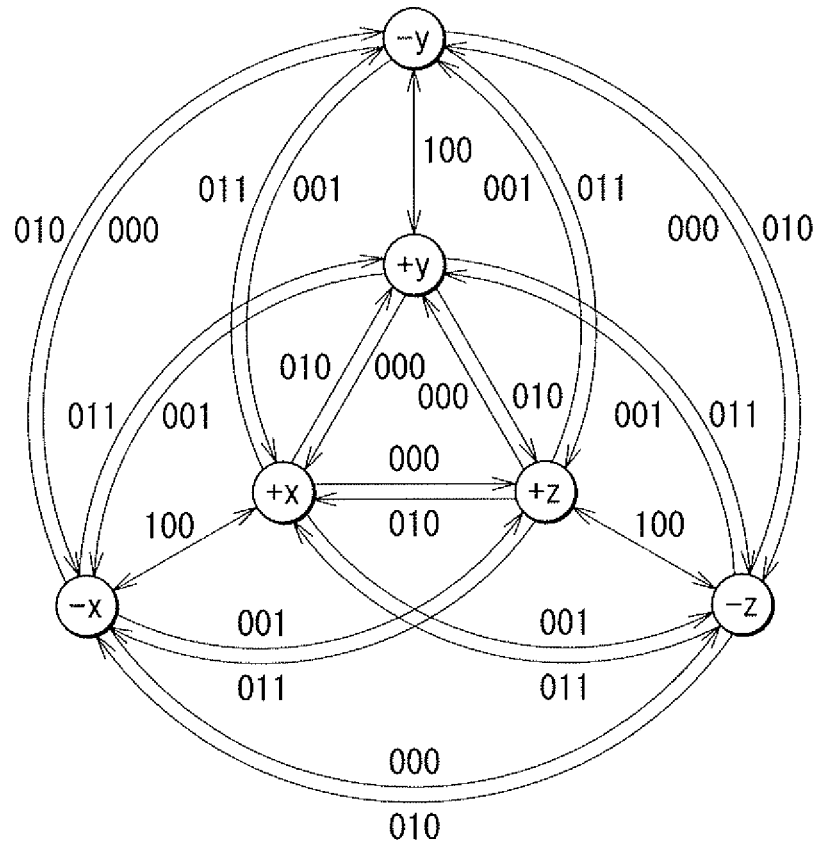
[Fig. 5]
| TxF9, TxR9, TxP9 | DS=+x | DS=-x | DS=+y | DS=-y | DS=+z | DS=-z |
|---|---|---|---|---|---|---|
| 000 | +z | -z | +x | -x | +y | -y |
| 001 | -z | +z | -x | +x | -y | +y |
| 010 | +y | -y | +z | -z | +x | -x |
| 011 | -y | +y | -z | +z | -x | +x |
| 1XX | -x | +x | -y | +y | -z | +z |

[Fig. 6]
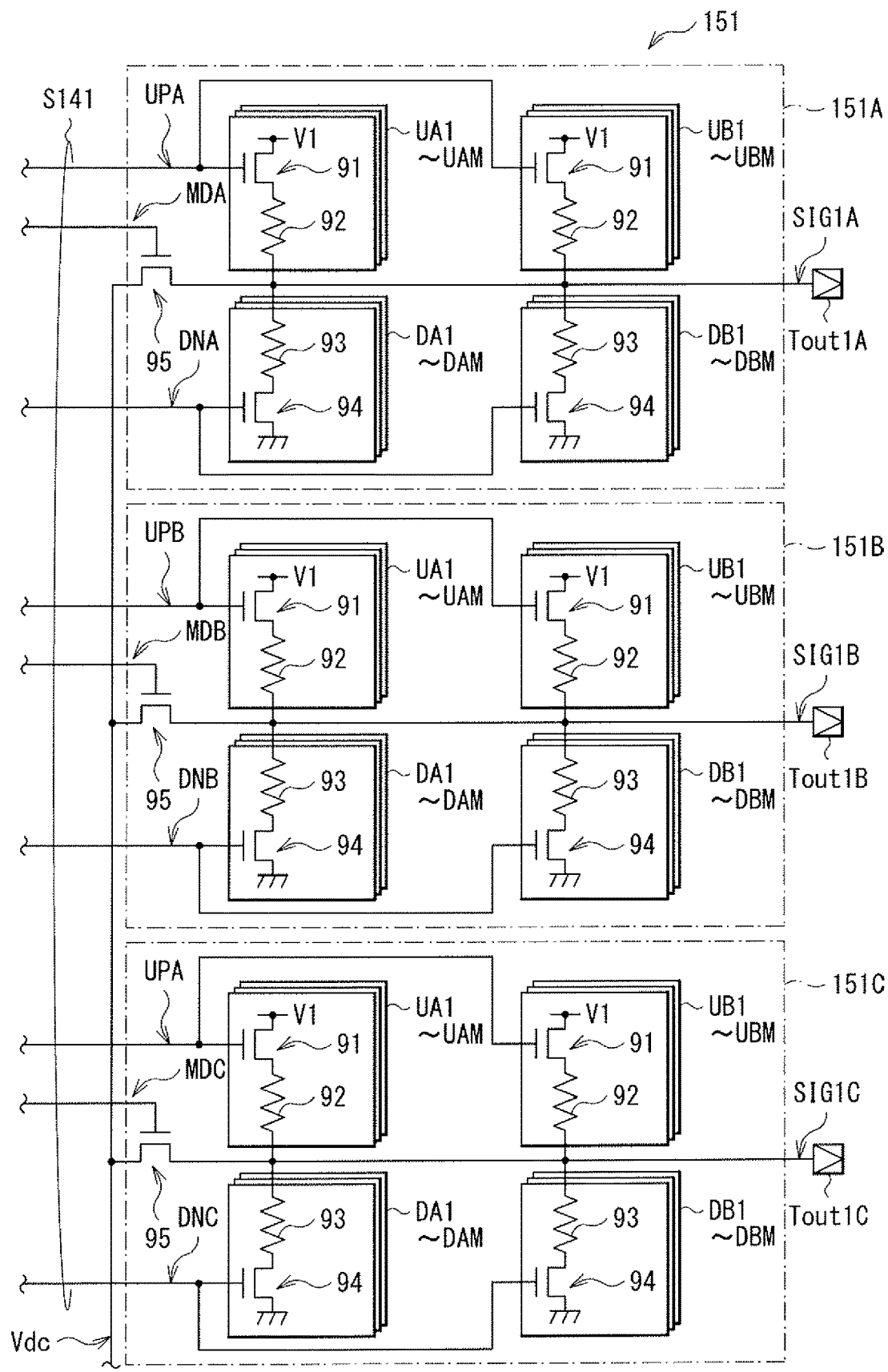

[Fig. 7]

| SYMBOL | Tx1 | Tx2 | Tx3 | UPA | MDA | DNA | UPB | MDB | DNB | UPC | MDC | DNC | SIG1A | SIG1B | SIG1C |
|---|---|---|---|---|---|---|---|---|---|---|---|---|---|---|---|
| +x | 1 | 0 | 0 | 1 | 0 | 0 | 0 | 0 | 1 | 0 | 1 | 0 | VH | VL | VM |
| −x | 0 | 1 | 1 | 0 | 0 | 1 | 1 | 0 | 0 | 0 | 1 | 0 | VL | VH | VM |
| +y | 0 | 1 | 0 | 0 | 1 | 0 | 1 | 0 | 0 | 0 | 0 | 1 | VM | VH | VL |
| −y | 1 | 0 | 1 | 0 | 1 | 0 | 0 | 0 | 1 | 1 | 0 | 0 | VM | VL | VH |
| +z | 0 | 0 | 1 | 0 | 0 | 1 | 0 | 1 | 0 | 1 | 0 | 0 | VL | VM | VH |
| −z | 1 | 1 | 0 | 1 | 0 | 0 | 0 | 1 | 0 | 0 | 0 | 1 | VH | VM | VL |

[Fig. 8]
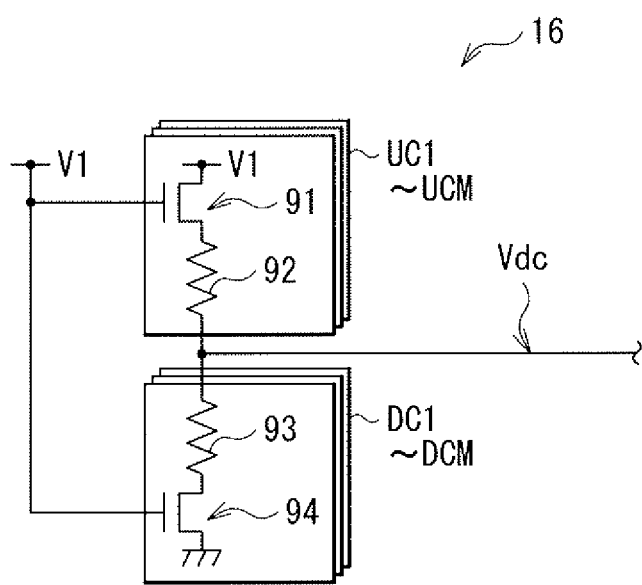

[Fig. 9]
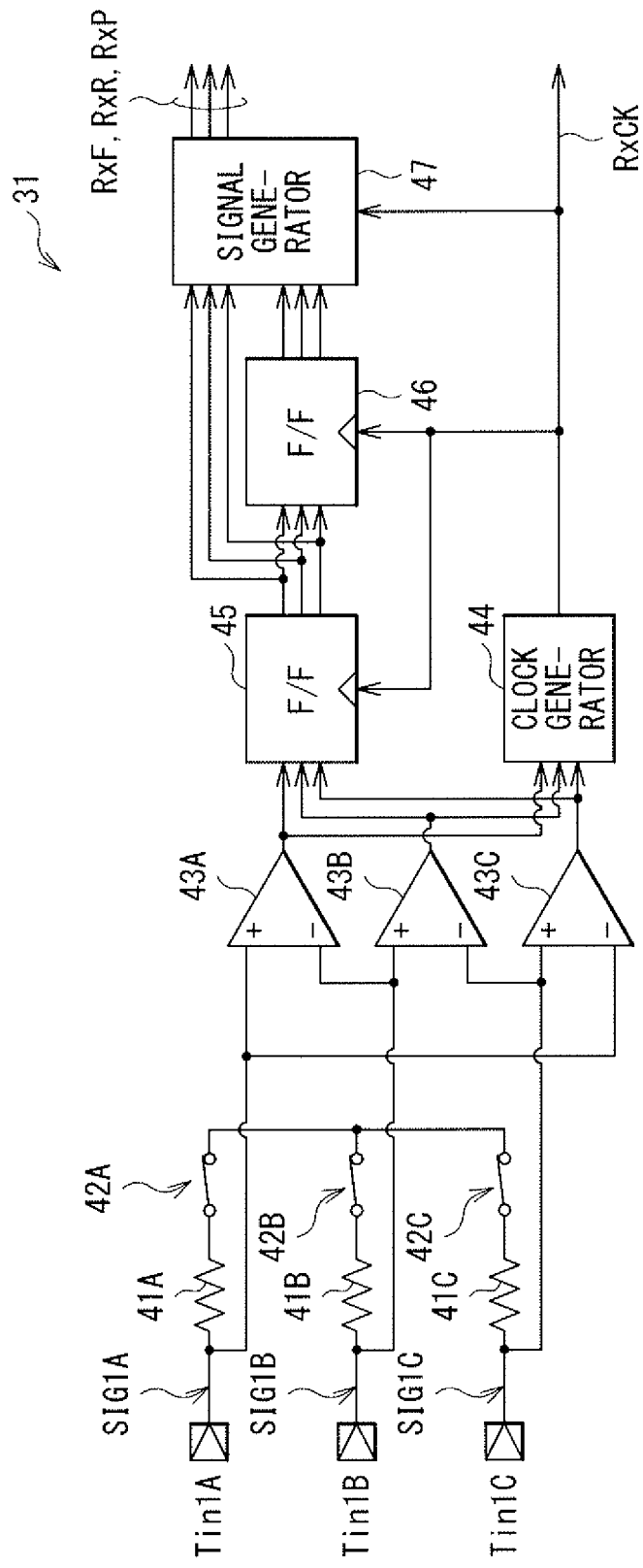

[Fig. 10]
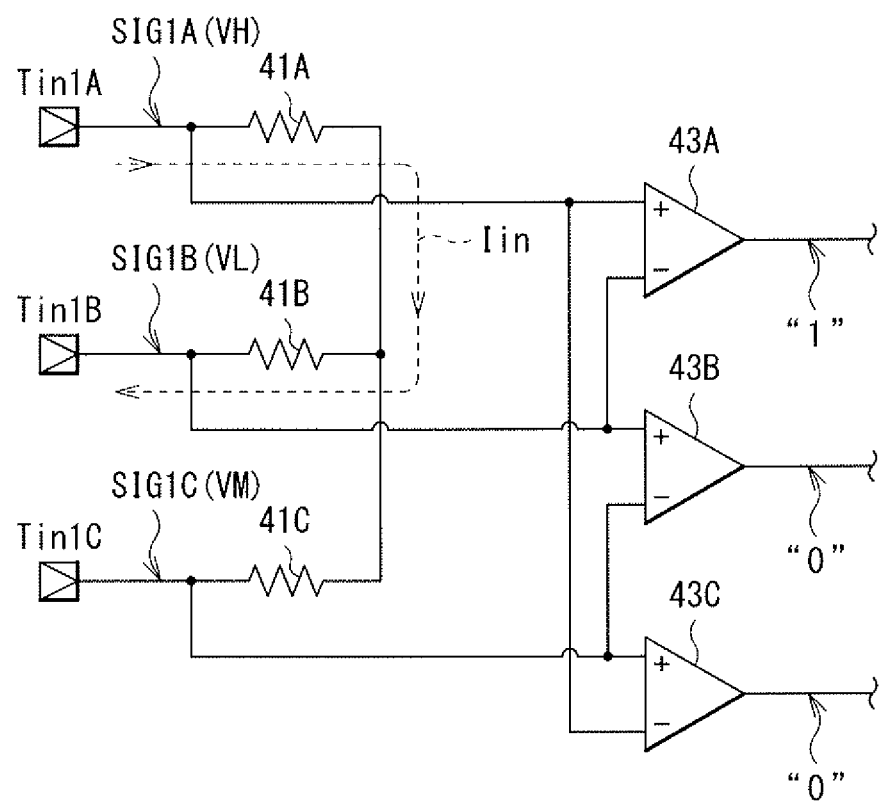

[Fig. 11]
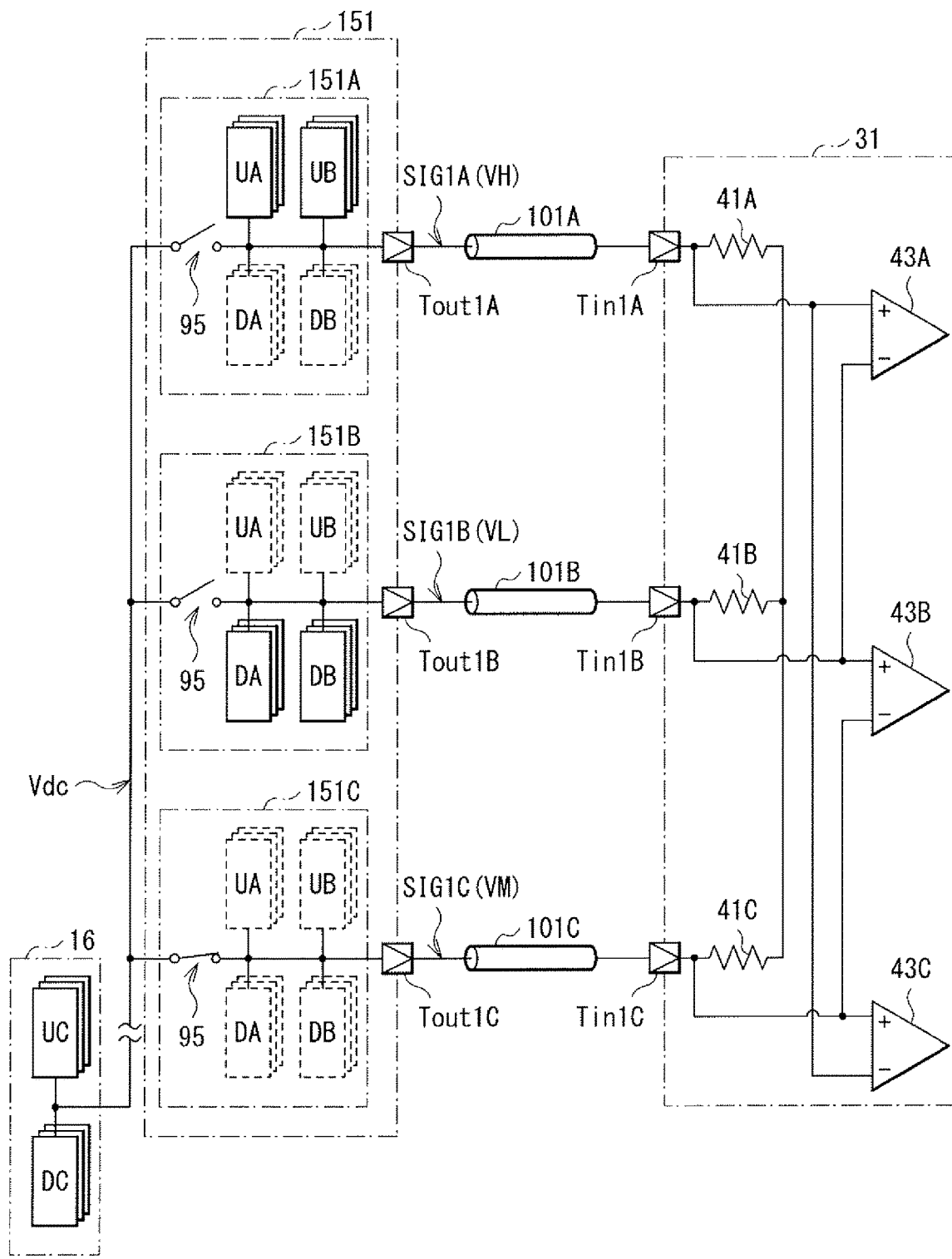

[Fig.12]
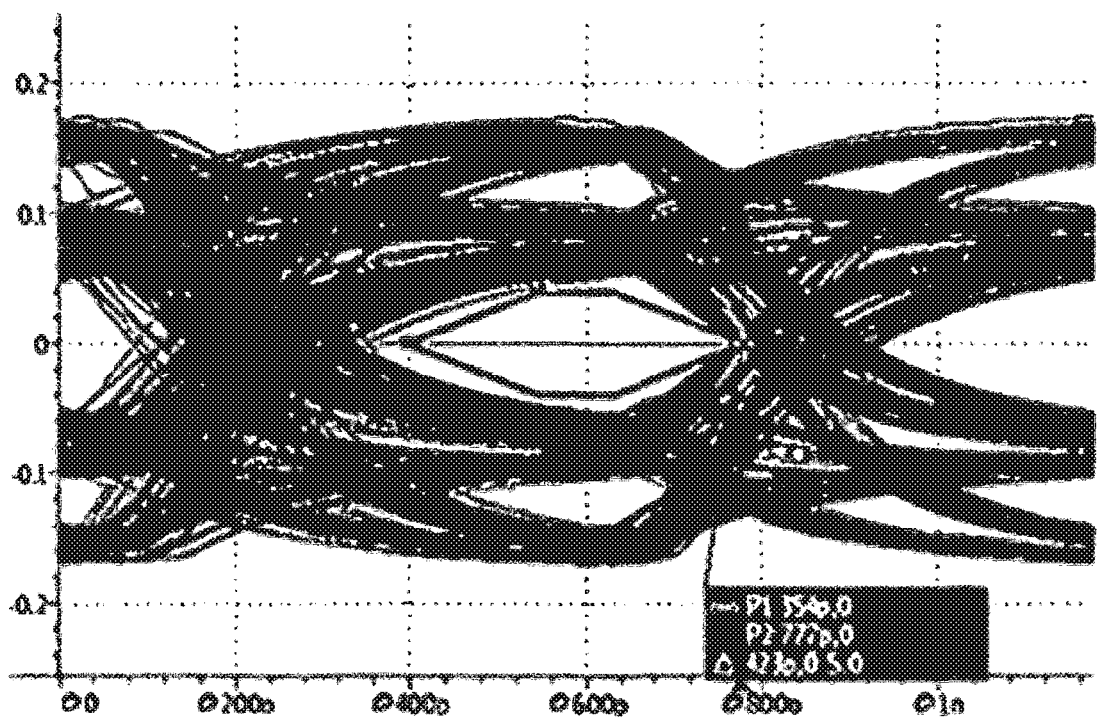

[Fig. 13]
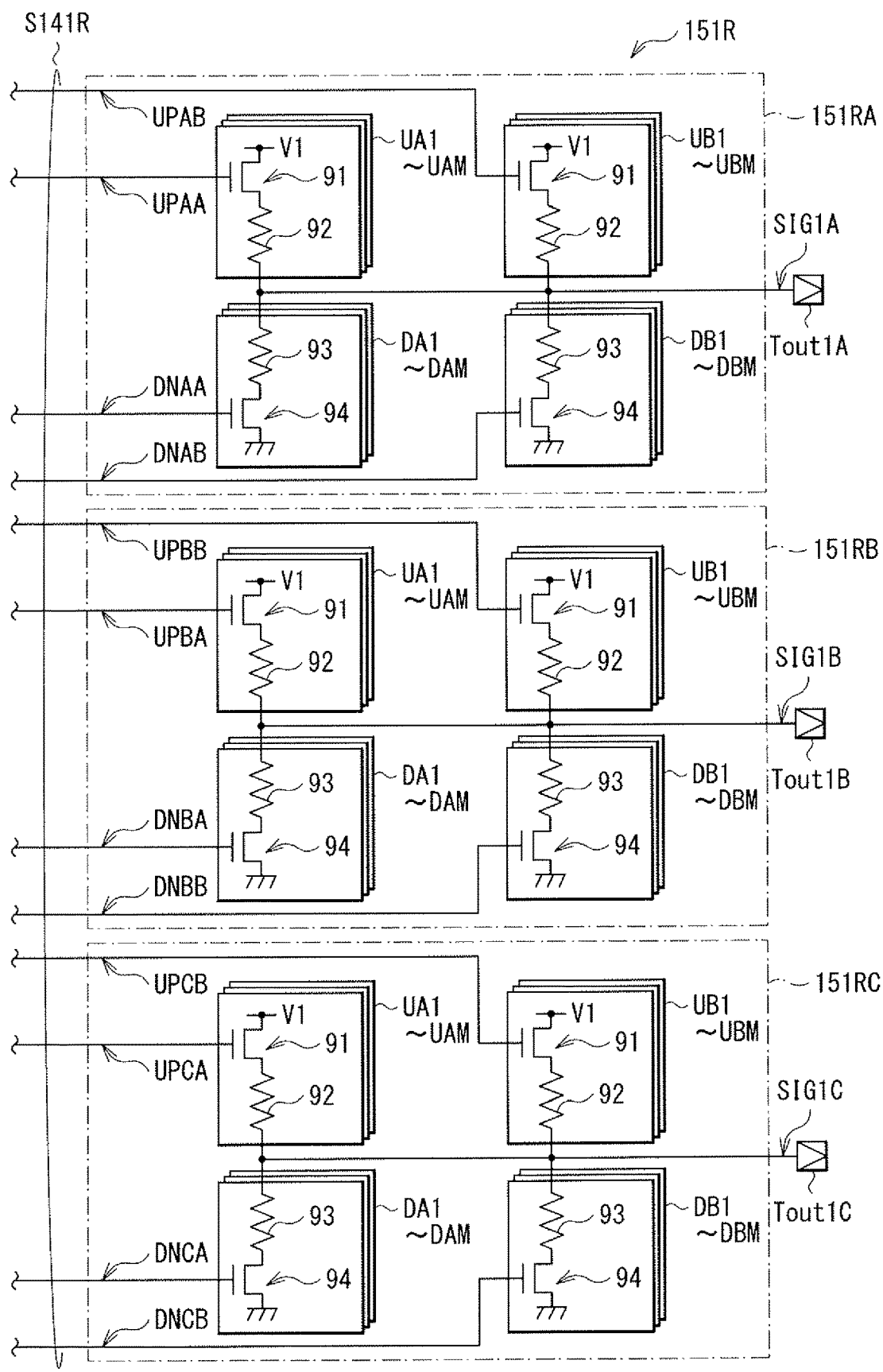

[Fig. 14]
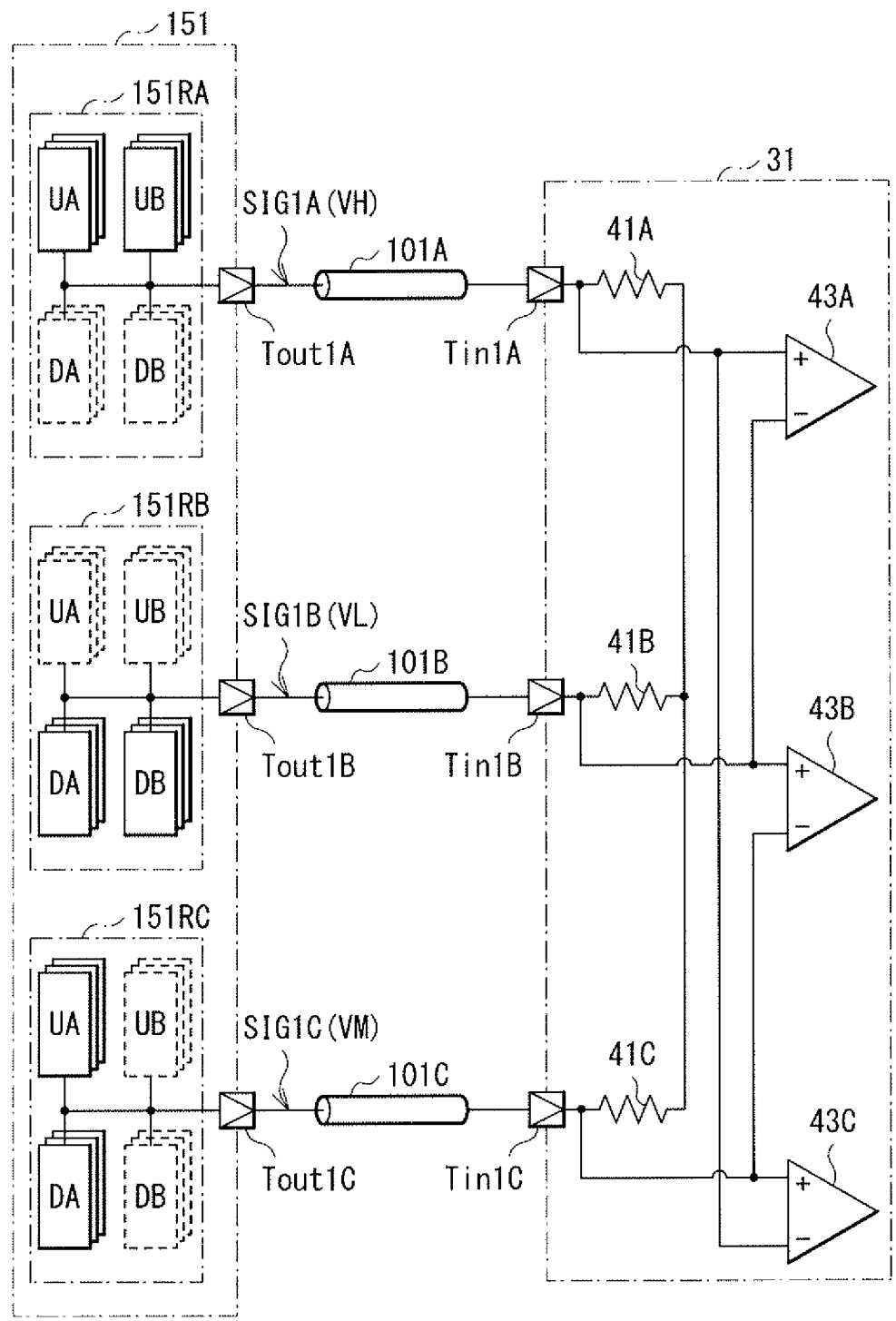

[Fig.15]
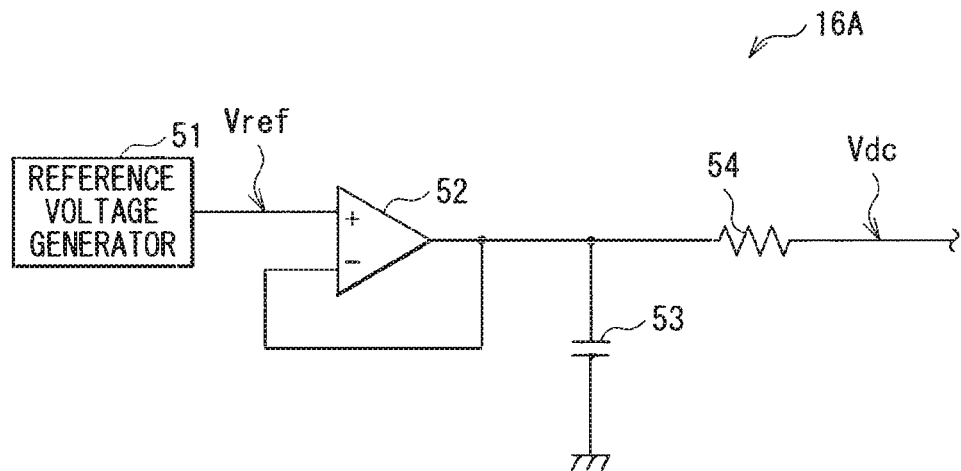
[Fig.16]
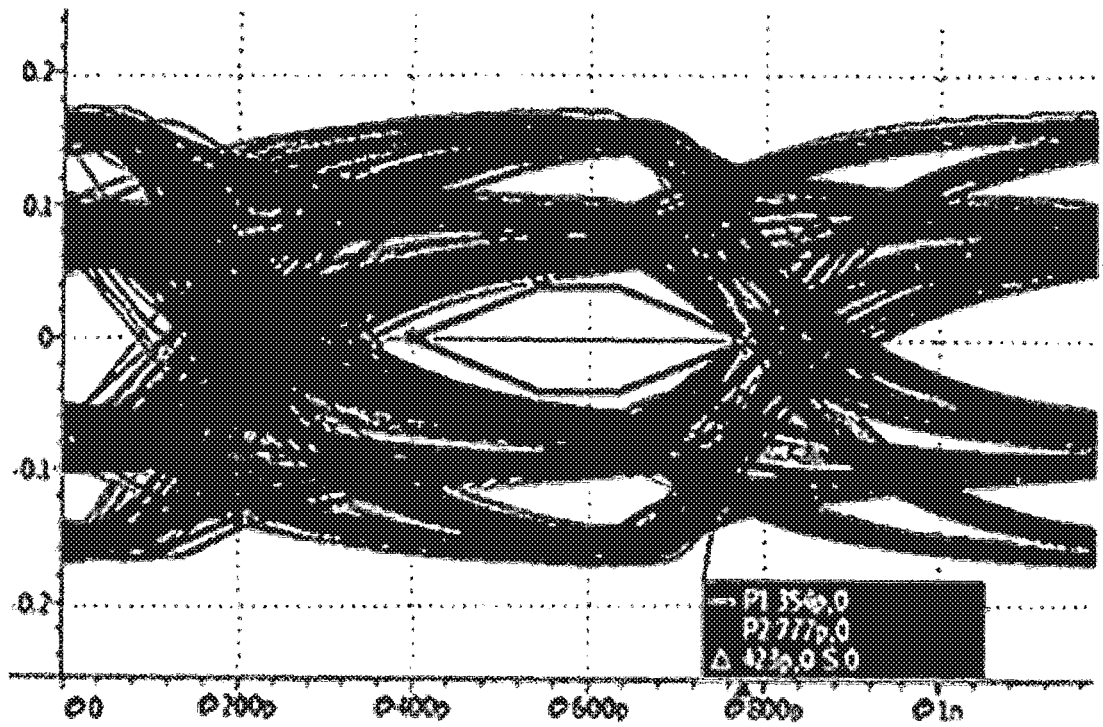

[Fig. 17]
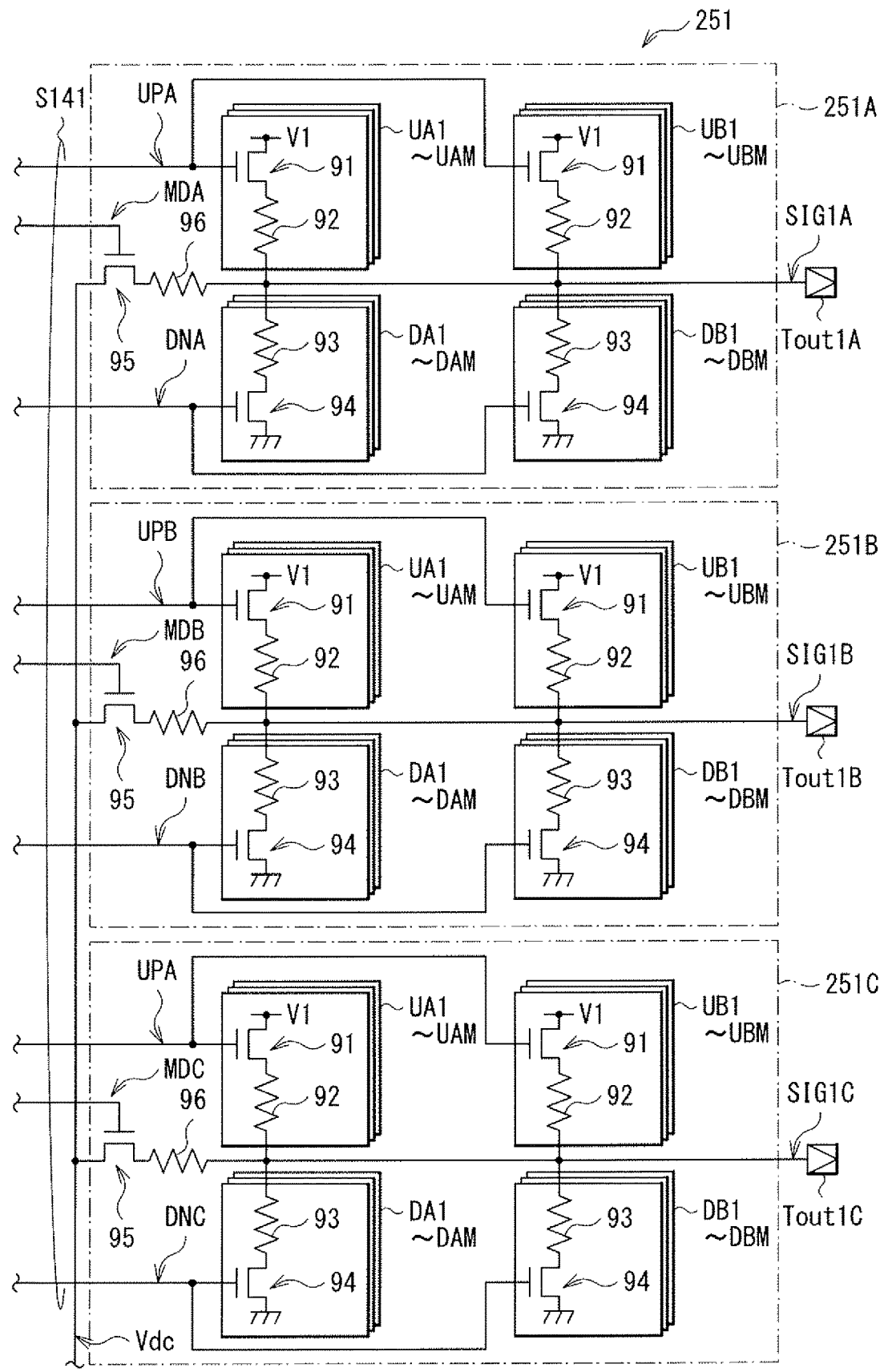

[Fig. 18]
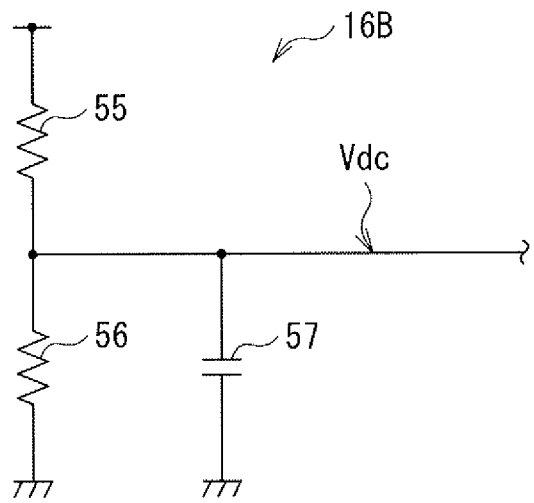
[Fig. 19]
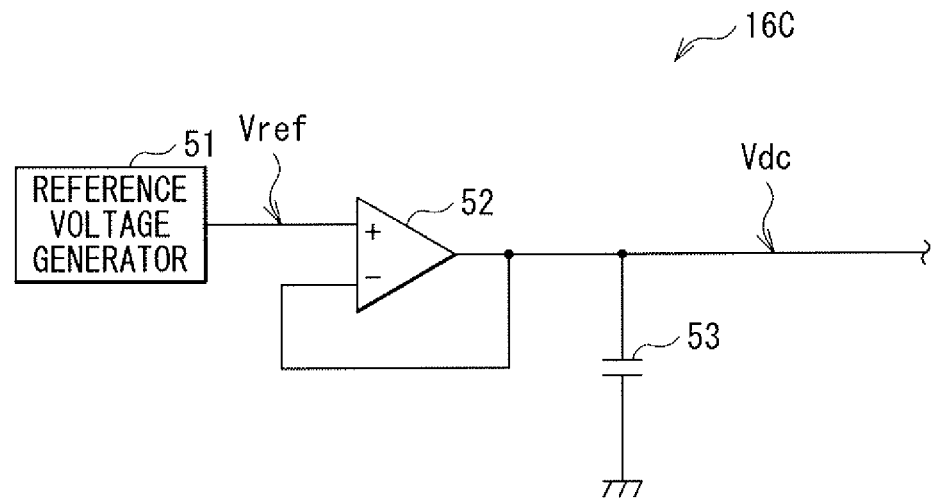

[Fig. 20A]
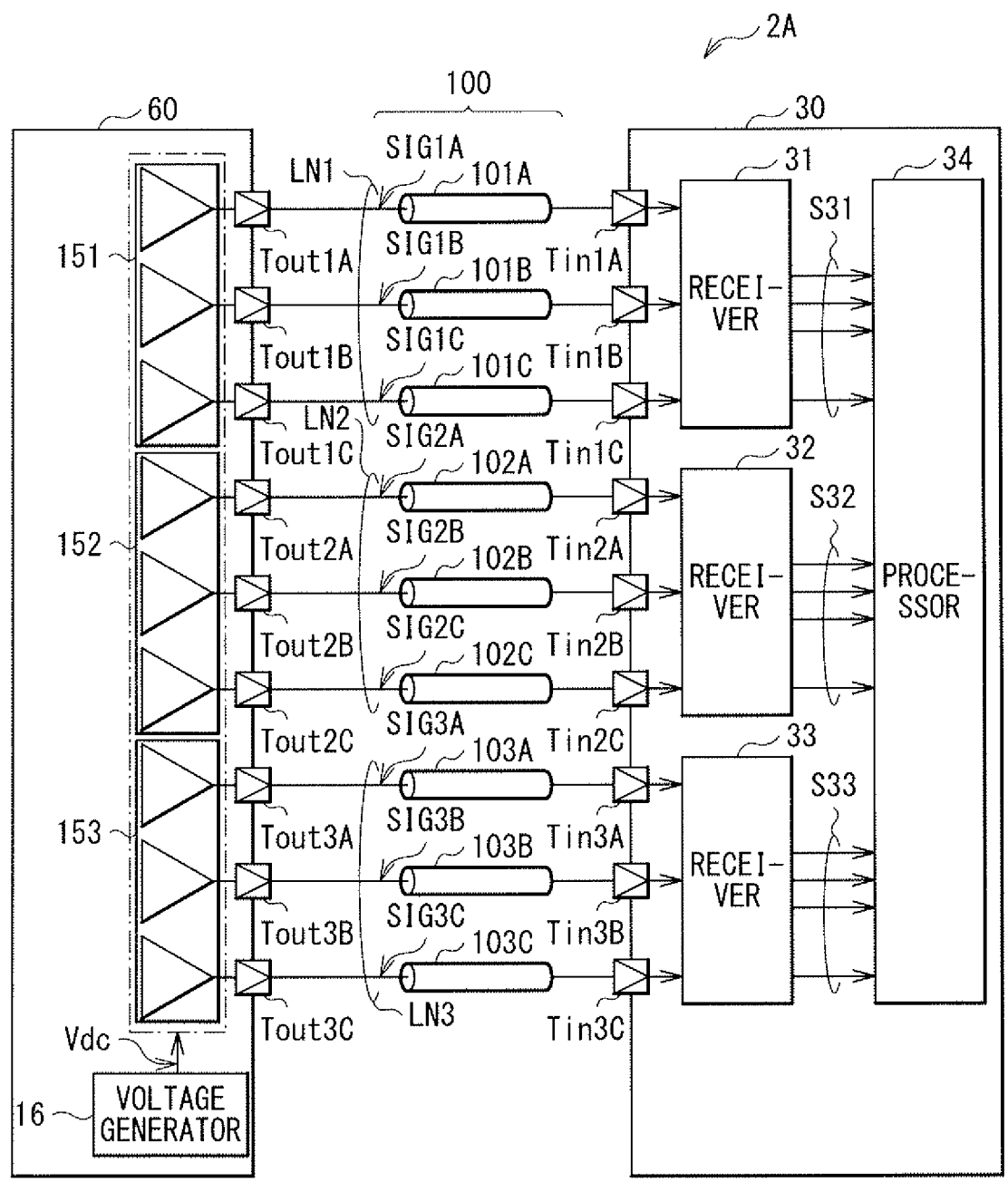

[Fig. 20B]
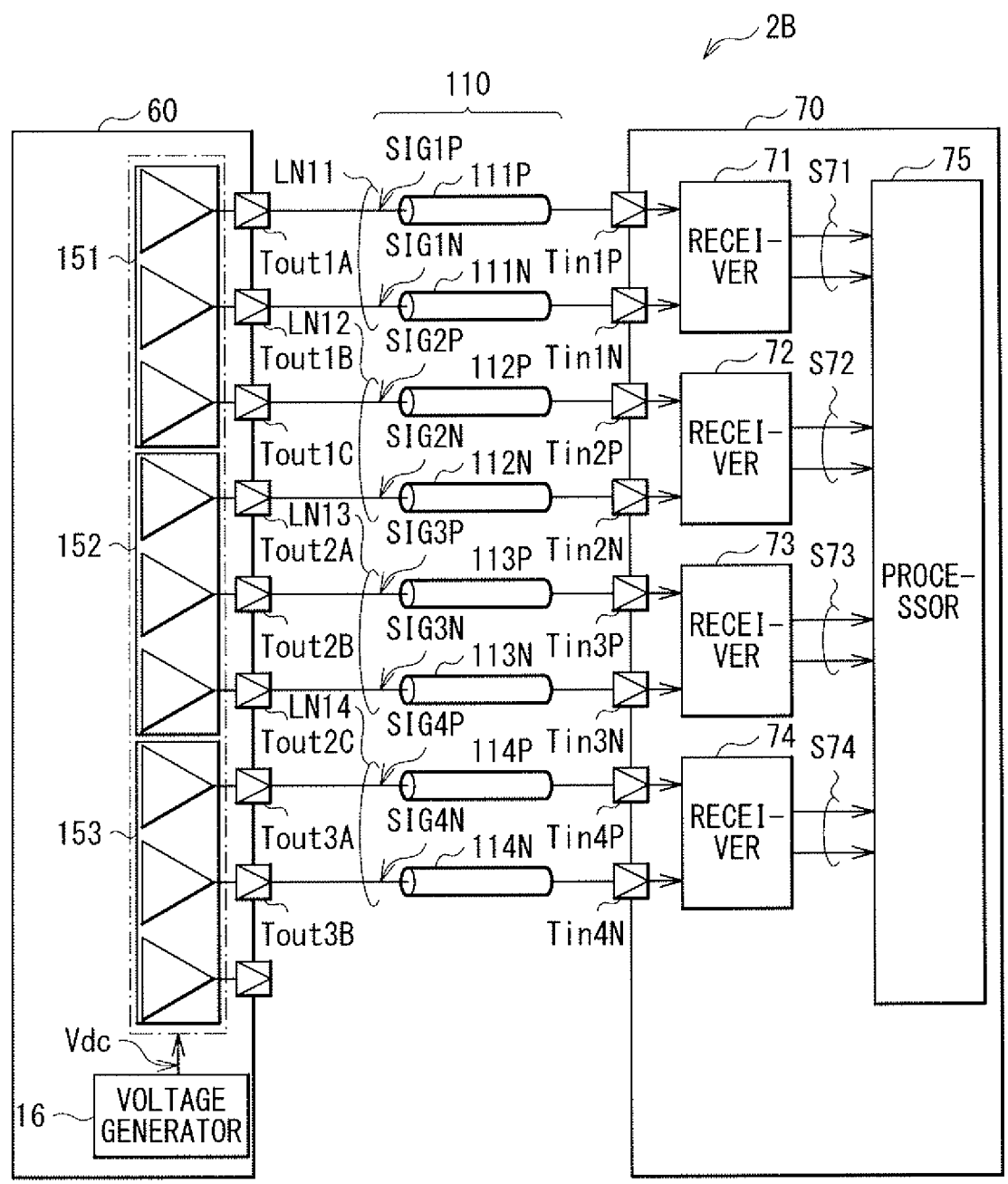

[Fig. 21]
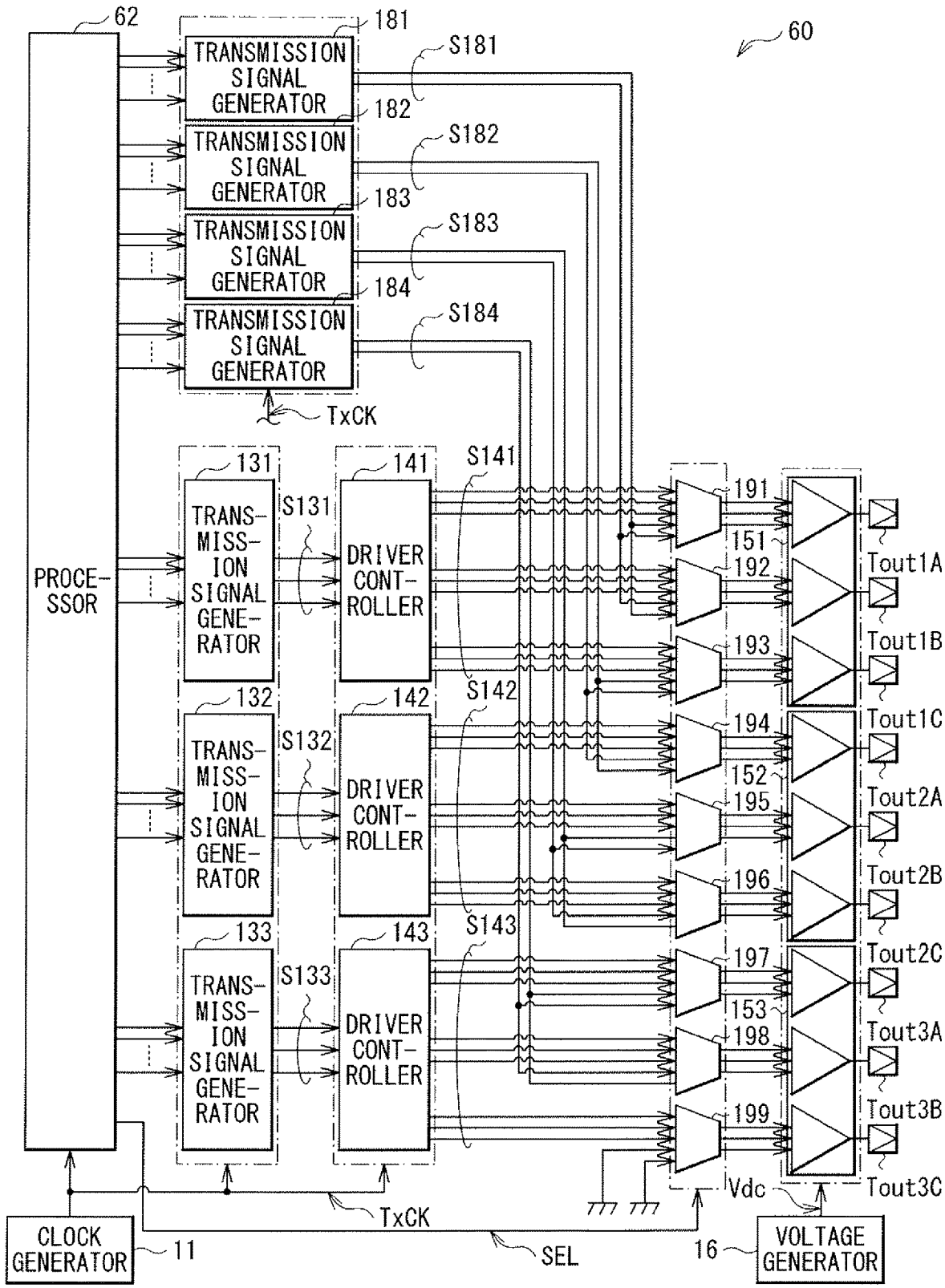

[Fig. 22]
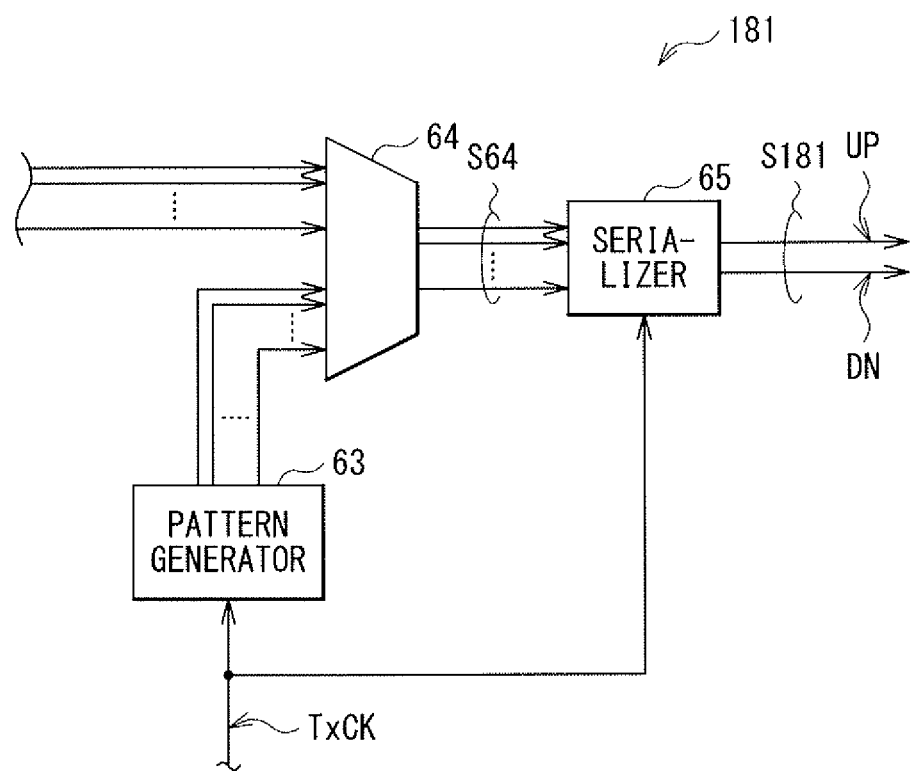

[Fig. 23]
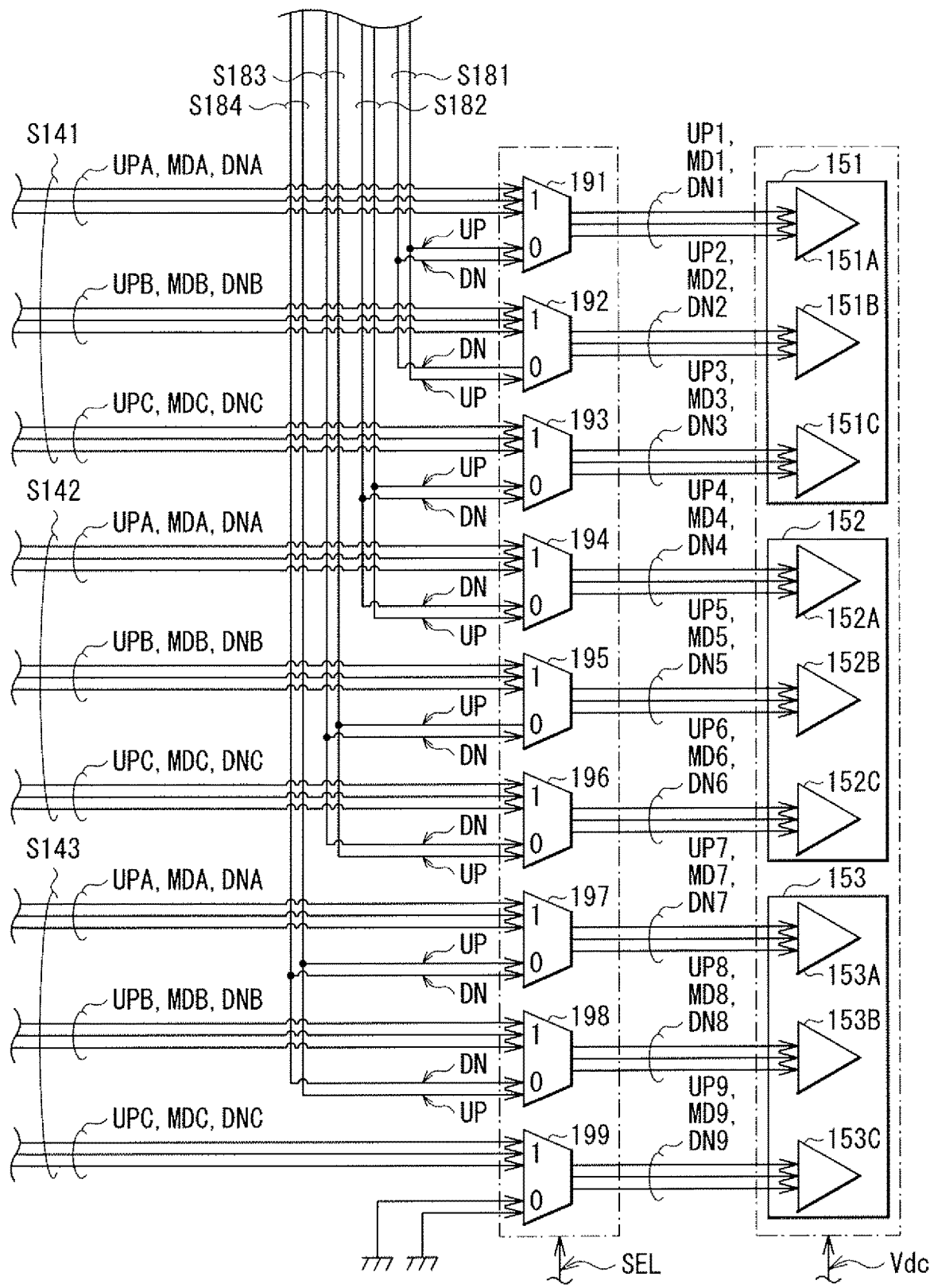

[Fig. 24]
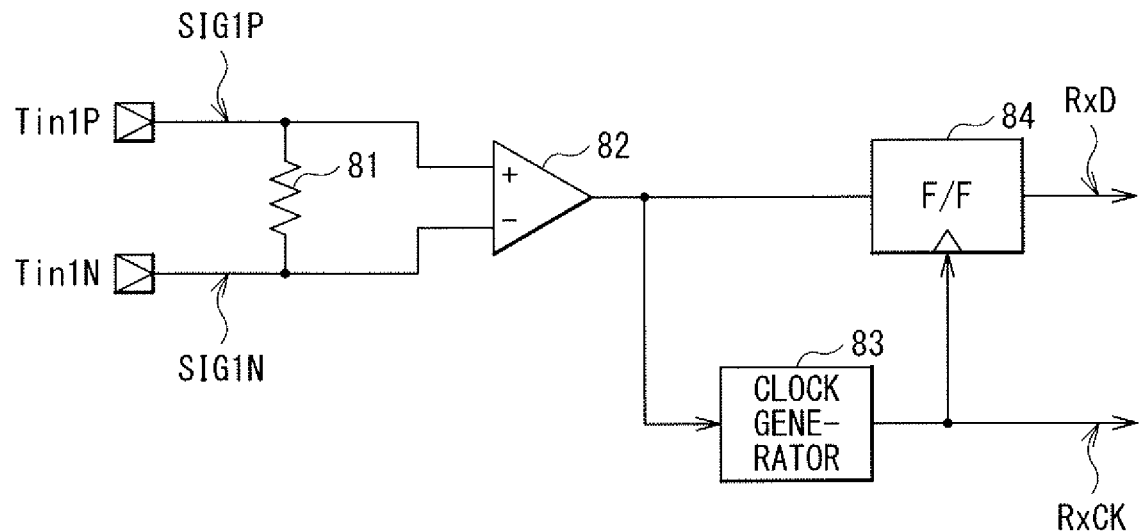
[Fig. 25]
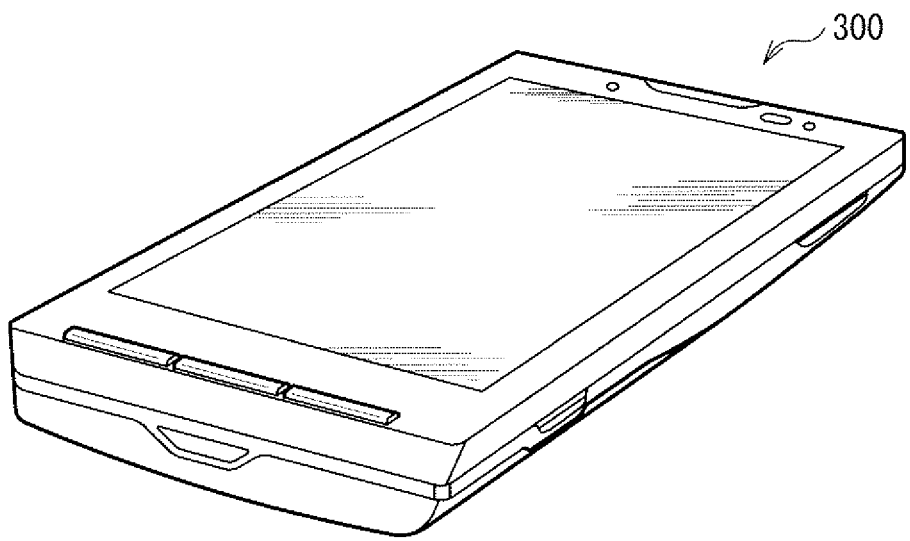

[Fig. 26]
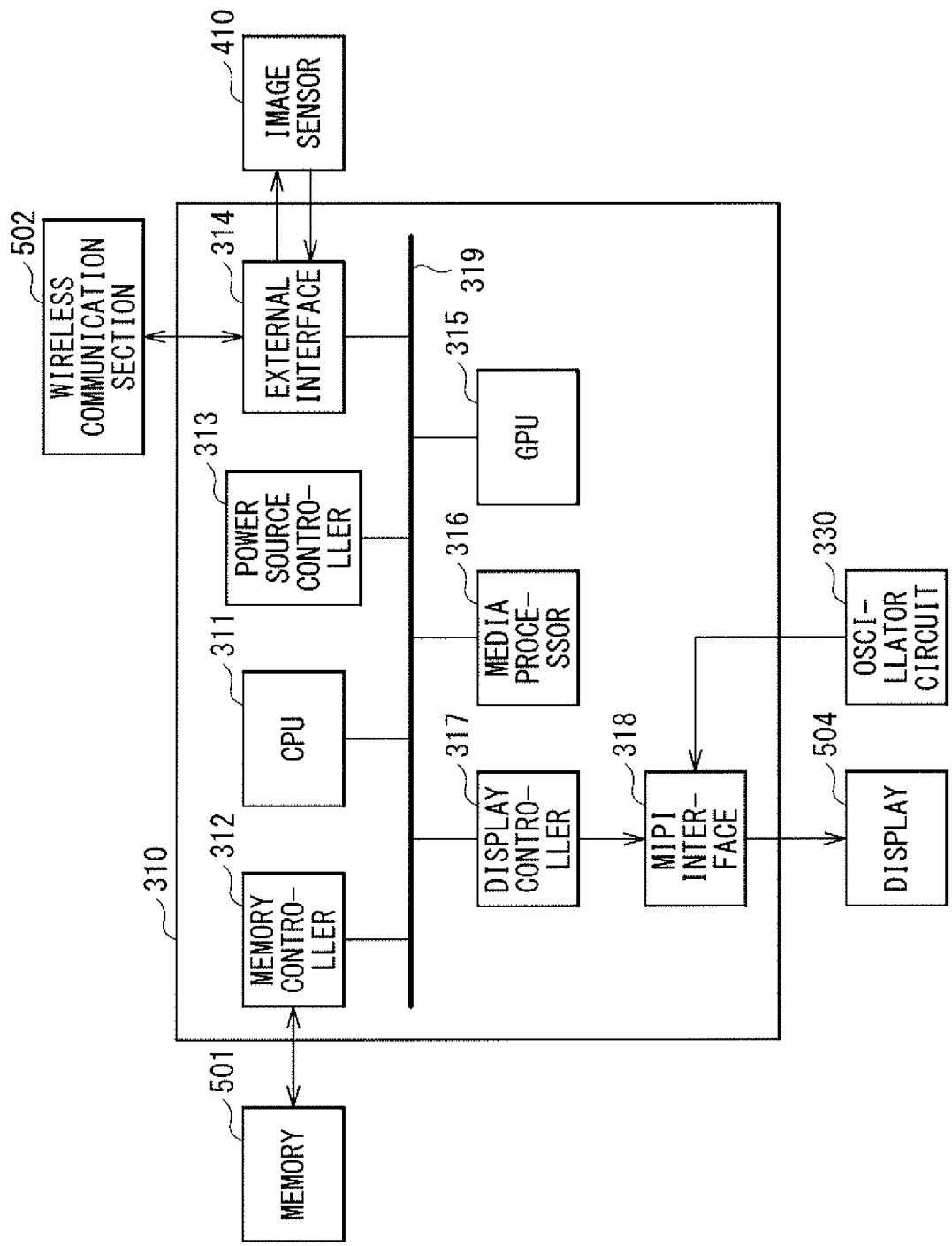

[Fig. 27]
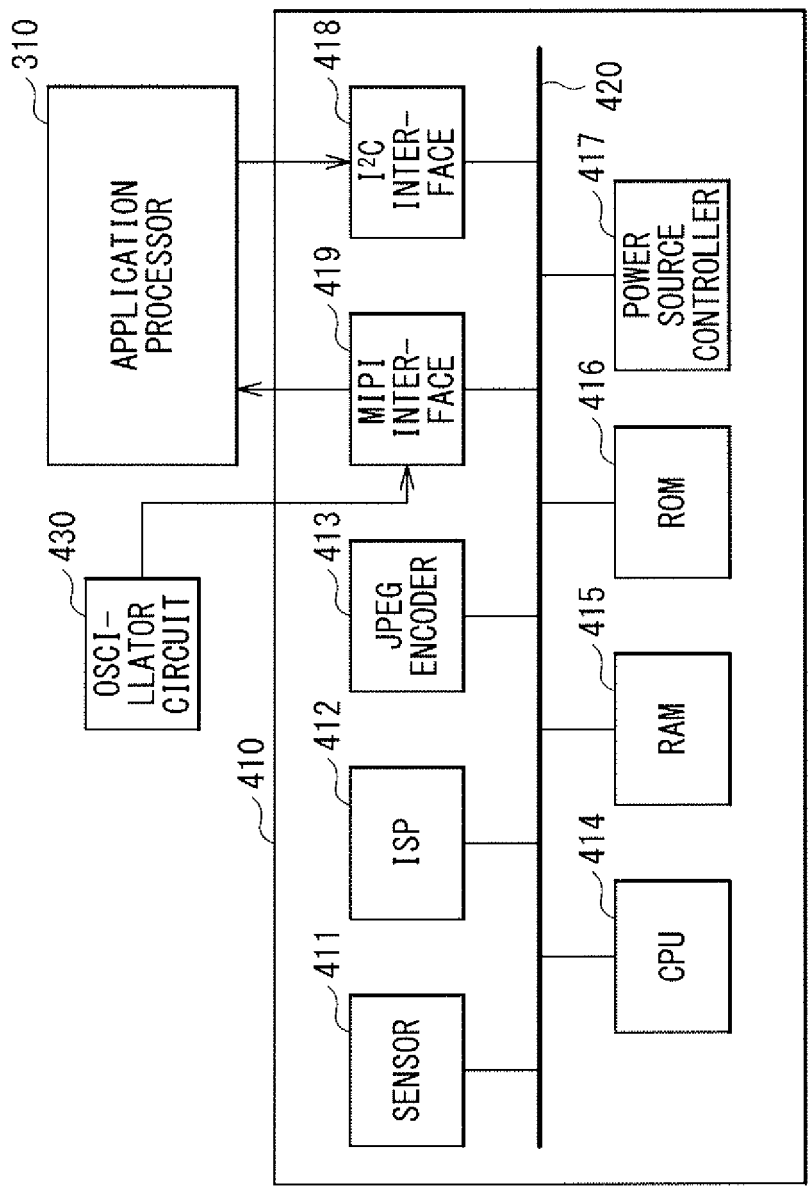

[Fig. 28]
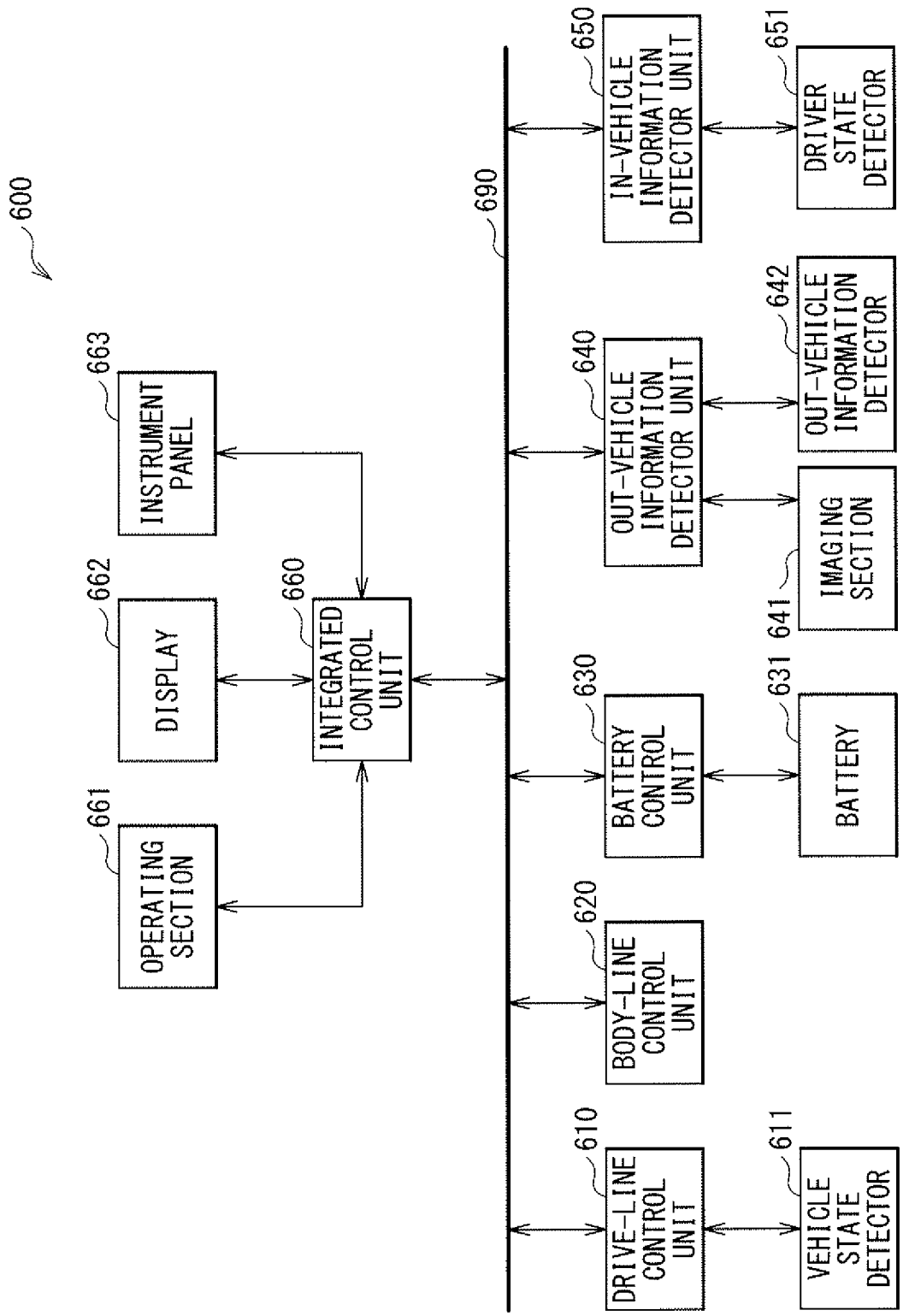

TRANSMISSION DEVICE AND COMMUNICATION SYSTEM

CROSS REFERENCE TO RELATED APPLICATIONS

This application claims the benefit of Japanese Priority Patent Application JP 2016-108430 filed on May 31, 2016, the entire contents of which are incorporated herein by reference.

TECHNICAL FIELD

The present disclosure relates to a transmission device that transmits signals, and to a communication system that includes such a transmission device.

BACKGROUND ART

In association with highly-functional and multifunctional capabilities achieved in electronic apparatuses in recent years, a variety of devices such as semiconductor chips, sensors, and display devices have been built into the electronic apparatuses. A large amount of data has been exchanged to and from these devices, and the data amount has increased with advancing highly-functional and multi-functional capabilities of the electronic apparatuses. Therefore, the data exchange has been often carried out with use of a high-speed interface that makes it possible to transmit and receive data at a rate of several gigabits per second, for example.

In regard to methods of increasing transmission capacity, various technologies are disclosed. For example, there are disclosed communication systems that transmit three differential signals with use of three transmission lines in PTL1 and PTL2.

CITATION LIST

Patent Literature

PTL 1: Japanese Unexamined Patent Application Publication No. H06-261092.
PTL 2: U.S. Pat. No. 8,064,535 Specification

SUMMARY

Technical Problem

Meanwhile, in the electronic apparatuses, lower power consumption is typically desired, and lower power consumption is also expected in the communication system Accordingly, it is desirable to provide a transmission device and a communication system that allow for reduction in power consumption.

Solution to Problem

According to an embodiment of the present disclosure, there is provided a transmission device including a first transmitter, a second transmitter, and a voltage generator. The first transmitter has a plurality of drivers that each enable transmission of a signal using a plurality of voltages including a first voltage, a second voltage, and a third voltage between the first voltage and the second voltage, and transmits a sequence of symbols. The second transmitter has a plurality of drivers that each enable transmission of a signal using the plurality of voltages, and transmits a sequence of symbols. The voltage generator generates the third voltage. Each of the drivers of the first transmitter and the drivers of the second transmitter has a switch that transmits the third voltage generated by the voltage generator to an output terminal of the driver through turn-on operation of the switch.

According to an embodiment of the present disclosure, there is provided a communication system including a transmission device and a reception device. The transmission device includes a first transmitter, a second transmitter, and a voltage generator. The first transmitter has a plurality of drivers that each enable transmission of a signal using a plurality of voltages including a first voltage, a second voltage, and a third voltage between the first voltage and the second voltage, and transmits a sequence of symbols. The second transmitter has a plurality of drivers that each enable transmission of a signal using the plurality of voltages, and transmits a sequence of symbols. The voltage generator generates the third voltage. Each of the drivers of the first transmitter and the drivers of the second transmitter has a switch that transmits the third voltage generated by the voltage generator to an output terminal of the driver through turn-on operation of the switch.

In the transmission device and the communication system according to the respective embodiments of the present disclosure, each of the plurality of drivers in the first transmitter and the plurality of drivers in the second transmitter enables transmission of a signal using the plurality of voltages including the first voltage, the second voltage, and the third voltage. In each of the drivers of the first transmitter and the drivers of the. second transmitter, the third voltage generated by the voltage generator is transmitted to the output terminal of the driver when the switch is turned on.

Advantageous Effects of Invention

According to the transmission device and the communication system in the respective embodiments of the present disclosure, each of the drivers of the first transmitter and the drivers of the second transmitter is provided with the switch that transmits the third voltage generated by the voltage generator to the output terminal of the driver through turn-on operation of the switch, which allows for reduction in power source. It is to be noted that some effects described here are not necessarily limitative, and any of other effects described herein may be achieved.

It is to be understood that both the foregoing general description and the following detailed description are exemplary, and are intended to provide further explanation of the technology as claimed.

BRIEF DESCRIPTION OF DRAWINGS

The accompanying drawings are included to provide a further understanding of the present disclosure, and are incorporated in and constitute a part of this specification. The drawings illustrate embodiments and, together with the specification, serve to explain the principles of the present technology.

FIG. 1 is a block diagram illustrating a configuration example of a communication system according to a first embodiment of the present disclosure.

FIG. 2 is an explanatory diagram illustrating voltages of signals that the communication system illustrated in FIG. 1 transmits and receives.

FIG. 3 is a block diagram illustrating a configuration example of a transmission signal generator illustrated in FIG. 1.

FIG. 4 is an explanatory diagram illustrating transition of symbols that the communication system illustrated in FIG. 1 transmits and receives.

FIG. 5 is a table representing an operation example of a transmission symbol generator illustrated in FIG. 4.

FIG. 6 is a block diagram illustrating a configuration example of a driver illustrated in FIG. 1.

FIG. 7 is a table representing an operation example of a driver controller and the driver illustrated in FIG. 1.

FIG. 8 is a circuit diagram illustrating a configuration example of a voltage generator illustrated in FIG. 1.

FIG. 9 is a block diagram illustrating a configuration example of a receiver illustrated in FIG. 1.

FIG. 10 is an explanatory diagram illustrating an example of receiving operation of the receiver illustrated in FIG. 9.

FIG. 11 is an explanatory diagram illustrating an operation example of the driver illustrated in FIG. 6.

FIG. 12 is an eye diagram illustrating a characteristic example of the communication system illustrated in FIG. 1.

FIG. 13 is a block diagram illustrating a configuration example of a driver according to a comparative example.

FIG. 14 is an explanatory diagram illustrating an operation example of the driver illustrated in FIG. 13.

FIG. 15 is a circuit diagram illustrating a configuration example of a voltage generator according to a modification example.

FIG. 16 is an eye diagram illustrating a characteristic example of a communication system according to a modification example.

FIG. 17 is a block diagram illustrating a configuration example of a driver according to another modification example.

FIG. 18 is a circuit diagram illustrating a configuration example of a voltage generator according to another modification example.

FIG. 19 is a circuit diagram illustrating a configuration example of a voltage generator according to still another modification example.

FIG. 20A is a block diagram illustrating a configuration example of a communication system according to a second embodiment.

FIG. 20B is a block diagram illustrating another configuration example of the communication system according to the second embodiment.

FIG. 21 is a block diagram illustrating a configuration example of a transmission device illustrated in FIGS. 20A and 20B.

FIG. 22 is a block diagram illustrating a configuration example of a transmission signal generator illustrated in FIG. 21.

FIG. 23 is a block diagram illustrating a configuration example of a selector illustrated in FIG. 21.

FIG. 24 is a block diagram illustrating a configuration example of a receiver illustrated in FIG. 20B.

FIG. 25 is a perspective view of an external appearance configuration of a smartphone to which the communication system according to any of the above-described embodiments is applied.

FIG. 26 is a block diagram illustrating a configuration example of an application processor to which the communication system according to any of the above-described embodiments is applied.

FIG. 27 is a block diagram illustrating a configuration example of an image sensor to which the communication system according to any of the above-described embodiments is applied.

FIG. 28 is a block diagram illustrating a configuration example of a vehicle. control system to which the communication system according to any of the above-described embodiments is applied.

DESCRIPTION OF EMBODIMENTS

Hereinafter, some embodiments of the present disclosure are described in detail with reference to the drawings. It is to be noted that description is given in the following order.
1. First Embodiment
2. Second Embodiment
3. Application Examples 1. First Embodiment Configuration Example FIG. 1 illustrates a configuration example of a communication system (communication system 1) that includes a transmission device according to a first embodiment of the present disclosure. The communication system 1 may perform communication using signals each having three voltage levels.

The communication system 1 may include a transmission device 10, a transmission line 100, and a reception device 30. The communication system 1 may transmit signals from the transmission device 10 to the reception device 30 through the transmission line 100. The transmission device 10 may have output terminals Tout1A, Tout1B, and Tout1C, output terminals Tout2A, Tout2B, and Tout2C, and output terminals Tout3A, Tout3B, and Tout3C. The transmission line 100 may have line paths 101A, 101B, and 101C, line paths 102A, 102B, and 102C, and line paths 103A, 103B, and 103C. The reception device 30 may have input terminals Tin1A, Tin1B, and Tin1C, input terminals Tin2A, Tin2B, and Tin2C, and input terminals Tin3A, Tin3B, and Tin3C. The output terminal Tout1A of the transmission device 10 and the input terminal Tin1A of the reception device 30 may be coupled to each other through the line path 101A. The output terminal Tout1B of the transmission device 10 and the input terminal Tin1B of the reception device 30 may be coupled to each other through the line path 101B. The output terminal Tout1C of the transmission device 10 and the input terminal Tin1C of the reception device 30 may be coupled to each other through the line path 101C. Similarly, the output terminal Tout2A of the transmission device 10 and the input terminal Tin2A of the reception device 30 may be coupled to each other through the line path 102A. The output terminal Tout2B of the transmission device 10 and the input terminal Tin2B of the reception device 30 may be coupled to each other through the line path 102B. The output terminal Tout2C of the transmission device 10 and the input terminal Tin2C of the reception device 30 may be coupled to each other through the line path 102C. Further, the output terminal Tout3A of the transmission device 10 and the input terminal Tin3A of the reception device 30 may be coupled to each other through the line path 103A. The output terminal Tout3B of the transmission device 10 and the input terminal Tin3B of the reception device 30 may be coupled to each other through the line path 103B. The output terminal Tout3C of the transmission device 10 and the input terminal Tin3C of the reception device 30 may be coupled to each other through the line path 103C. A characteristic impedance of each of the line paths 101A, 101B, 101C, 102A, 102B, 102C, 103A, 103B, and 103C may be about 50Ω in this example.

The line paths 101A, 101B, and 101C may configure a lane LN1. The line paths 102A, 102B, and 102C may configure a lane LN2. The line paths 103A, 103B, and 103C may configure a lane LN3. The communication system 1 may use the lane LN1 to transmit a signal SIG1A through the line path 101A; to transmit a signal SIG1B through the line path 101B; and to transmit a signal SIG1C through the line path 101C. Similarly, the communication system 1 may use the lane LN2 to transmit a signal SIG2A through the line path 102A; to transmit a signal SIG2B through the line path 102B; and to transmit a signal SIG2C through the line path 102C. Further, the communication system 1 may use the lane LN3 to transmit a signal SIG3A through the line path 103A; to transmit a signal SIG3B through the line path 103B; and to transmit a signal SIG3C through the line path 103C. Hereinafter, to represent any set of the signals among a set of the signals SIG1A, SIG1B, and SIG1C; a set of the signals SIG2A, SIG2B, and SIG2C; and a set of the signals SIG3A, SIG3B, and SIG3C, a set of signals SIGA, SIGB, and SIGC is used as appropriate. Each of the signals SIGA, SIGB, and SIGC may make transition involving three voltage levels (high-level voltage VH, medium-level voltage VM, and low-level voltage VL).

FIG. 2 illustrates the voltage levels of each of the signals SIGA, SIGB, and SIGC. The transmission device 10 may use the three signals SIGA, SIGB, and SIGC to transmit six symbols "+x", "−x", "+y", "−y", "+z", and "−z". For example, in transmitting the symbol "+x", the transmission device 10 may set the signal SIGA to the high-level voltage VH; may set the signal SIGB to the low-level voltage VL; and may set the signal SIGC to the medium-level voltage VM. In transmitting the symbol "−x", the transmission device 10 may set the signal SIGA to the low-level voltage VL; may set the signal SIGB to the high-level voltage VH; and may set the signal SIGC to the medium-level voltage VM. In transmitting the symbol "+y", the transmission device 10 may set the signal SIGA to the medium-level voltage VM; may set the signal SLOB to the high-level voltage VH; and may set the signal SIGC to the low-level voltage VL. In transmitting the symbol "−y", the transmission device 10 may set the signal SIGA to the medium-level voltage VM; may set the signal SIGB to the low-level voltage VL; and may set the signal SIGC to the high-level voltage VH. In transmitting the symbol "+z", the transmission device 10 may set the signal SIGA to the low-level voltage VL; may set the signal SIGB to the medium-level voltage VM; and may set the signal SIGC to the high-level voltage VH. In transmitting the symbol "−z", the transmission device 10 may set the signal SIGA to the high-level voltage VH; may set the signal SIGB to the medium-level voltage VM; and may set the signal SIGC to the low-level voltage VL.

Transmission Device 10

As illustrated in FIG. 1, the transmission device 10 may have a clock generator 11, a processor 12, transmission signal generators 131, 132, and 133, driver controllers 141, 142, and 143, drivers 151, 152, and 153, and a voltage generator 16.

The clock generator 11 may generate a clock signal TxCK. A frequency of the clock signal TxCK may be, for example, about 1.7 GHz. It is to be noted that the frequency of the clock signal TxCK is not limited thereto. For example, when any of circuits in the transmission device 10 is configured with use of a so-called half-rate architecture, it may be possible to set the frequency of the clock signal TxCK at about 0.85 GHz. The clock generator 11 may be configured with use of, for example, a PLL (Phase-Locked Loop), and may generate the clock signal TxCK on the basis of a reference clock (not illustrated) that is supplied from an external circuit of the transmission device 10, for example. Thereafter, the clock generator 11 may provide the clock signal TxCK to the processor 12, the transmission signal generators 131, 132, and 133, and the driver controllers 141, 142, and 143.

The processor 12 may generate respective data to be transmitted using the lanes LN1, LN2, and LN3 by performing predetermined processing operation. Thereafter, the processor 12 may provide data to be transmitted using the lane LN1 to the transmission signal generator 131; may provide data to be transmitted using the lane LN2 to the transmission signal generator 132; and may provide data to be transmitted using the lane LN3 to the transmission signal generator 133.

The transmission signal generator 131 may generate a transmission signal S131 on the basis of the data provided from the processor 12. The transmission signal generator 132 may generate a transmission signal S132 on the basis of the data provided from the processor 12. The transmission signal generator 133 may generate a transmission signal S133 on the basis of the data provided from the processor 12.

FIG. 3 illustrates a configuration example of the transmission signal generator 131. It is to be noted that a configuration of each of the transmission signal generators 132 and 133 may be also similar to such a configuration example. The transmission signal generator 131 may have a mapper 21, serializers 22F, 22R, and 22P, and a transmission symbol generator 23.

The mapper 21 may generate transition signals TxF0 to TxF6, TxR0 to TxR6, and TxP0 to TxP6 by performing predetermined mapping processing operation on the basis of the data provided from the processor 12, and clock signal TxCK. Here, a set of the transition signals TxF0, TxR0, and TxP0 may indicate symbol transition in a sequence of symbols that the transmission device 10 transmits using the lane LN1. In a similar manner, a set of the transition signals TxF1, TxR1, and TxP1, a set of the transition signals TxF2, TxR2, and TxP2, a set of the transition signals TxF3, TxR3, and TxP3, a set of the transition signals TxF4, TxR4, and TxP4, a set of the transition signals TxF5, TxR5, and TxP5, and a set of the transition signals TxF6, TxR6, and TxP6 may each indicate symbol transition. In other words, the mapper 21 may generate seven sets of the transition signals. Hereinafter, to represent any one set out of seven sets of the transition signals, transition signals TxF, TxR, and TxP are used as appropriate.

FIG. 4 illustrates a relationship between the transition signals TxF, TxR, and TxP and symbol transition. Numerical values of three digits given to each transition indicate values of the transition signals TxF, TxR, and TxP in this order.

The transition signal TxF (Flip) may cause symbol transition between "+x" and "−x", between "+y" and "−y", and between "+z" and "−z". Specifically, when the transition signal TxF is "1", the transition may take place to change polarity of the symbol (for example, from "+x" to "−x"). When the transition signal TxF is "0", such transition may not take place.

When the transition signal TxF is "0", the transition signals TxR (Rotation) and TxP (Polarity) may cause symbol transition between "+x" and a symbol other than "−x", between "+y" and a symbol other than "−y", and between "+z" and a symbol other than "−z" when the signal TxF is "0". Specifically, when the transition signals TxR and TxP are "1" and "0", respectively, the transition may take place in a clockwise direction in FIG. 4 while keeping the polarity of the symbol (for example, transition from "+x" to "+y"). When the transition signals TxR and TxP are "1" and "1", respectively, the transition may take place in a clockwise direction in FIG. 4 while changing the polarity of the symbol (for example, transition from "+x" to "−y"). Further, when the transition signals TxR and TxP are "0" and "0", respectively, the transition may take place in a counterclockwise direction in FIG. 4 while keeping the polarity of the symbol (for example, transition from "+x" to "+z"). When the transition signals TxR and TxP are "0" and "1", respectively, the transition may take place in a counterclockwise direction in FIG. 4 while changing the polarity of the symbol (for example, transition from "+x" to "−z").

The mapper 21 may generate seven sets of these transition signals TxF, TxR, and TxP. From among these seven sets of the transition signals TxF, TxR, and TxP (transition signals TxF0 to TxF6, TxR0 to TxR6, and TxP0 to TxP6), the mapper 21 may provide the transition signals TxF0 to TxF6 to the serializer 22F; may provide the transition signals TxR0 to TxR6 to the serializer 22R; and may provide the transition signals TxP0 to TxP6 to the serializer 22P.

The serializer 22F may generate a transition signal TxF9 by serializing the transition signals TxF0 to TxF6 in this order on the basis of the transition signals TxF0 to TxF6 and the clock signal TxCK. The serializer 22R may generate a transition signal TxR9 by serializing the transition signals TxR0 to TxR6 in this order on the basis of the transition signals TxR0 to TxR6 and the clock signal TxCK. The serializer 22P may generate a transition signal TxP9 by serializing the transition signals TxP0 to TxP6 in this order on the basis of the transition signals TxP0 to TxP6 and the clock signal TxCK.

The transmission symbol generator 23 may generate symbol signals Tx1, Tx2, and Tx3 on the basis of the transition signals TxF9, TxR9, and TxP9 and the clock signal TxCK, and may output the symbol signals Tx1, Tx2, and Tx3 as a transmission signal S131. The transmission symbol generator 23 may have a signal generator 24 and a flip-flop (F/F) 25.

The signal generator 24 may generate the symbol signals Tx1, Tx2, and Tx3 on the basis of the transition signals TxF9, TxR9, and TxP9, and symbol signals D1, D2, and D3. Specifically, the signal generator 24 may determine a symbol NS after transition as illustrated in FIG. 4 on the basis of a symbol (a symbol DS before transition) that the symbol signals D 1, D2, and D3 indicate, and the transition signals TxF9, TxR9, and TxP9 to output the determined symbol DS as the symbol signals Tx1, Tx2, and Tx3.

The flip-flop 25 may sample the symbol signals Tx1, Tx2, and Tx3 on the basis of the clock signal TxCK to output sampling results as the symbol signals D1, D2, and D3, respectively.

FIG. 5 illustrates an operation example of the transmission symbol generator 23. FIG. 5 represents the symbols NS that are generated on the basis of the symbols DS indicated by the symbol signals D1, D2, and D3, and the transition signals TxF9, TxR9, and TxP9. The description is provided by citing an example where the symbol DS is "+x". When the transition signals TxF9, TxR9, and TxP9 are "000", respectively, the symbol NS may be "+z", and when the transition signals TxF9, TxR9, and TxP9 are "001", respectively, the symbol NS may be "−z". When the transition signals TxF9, TxR9, and TxP9 are "010", respectively, the symbol NS may be "+y", and when the transition signals TxF9, TxR9, and TxP9 are "011", respectively, the symbol NS may be "−y". When the transition signals TxF9, TxR9, and TxP9 are "1xx", respectively, the symbol NS may be "−x". Here, "X" denotes that either "1" or "0" may be acceptable. The operation may be similar also in a case where the symbol DS is "−x", "+y", "−y", "+z" or "−z".

In such a manner, the transmission symbol generator 23 may generate the symbol signals Tx1, Tx2, and Tx3 to output the resultant symbol signals Tx1, Tx2, and Tx3 as the transmission signal S131. Thereafter, the transmission symbol generator 23 may provide the transmission signal S131 to the driver controller 141.

The driver controller 141 may generate a signal S141 on the basis of the transmission signal S131 and the clock signal TxCK. The driver controller 142 may generate a signal S142 on the basis of the transmission signal S132 and the clock signal TxCK. The driver controller 143 may generate a signal S143 on the basis of the transmission signal S133 and the clock signal TxCK. Each of the signals S141, S142, and S143 may have nine signals UPA, MDA, DNA, UPB, MDB, DNB, UPC, MDC, and DNC.

The driver 151 may generate signals SIG1A, SIG1B, and SIG1C on the basis of the signal S141. The driver 152 may generate signals SIG2A, SIG2B, and SIG2C on the basis of the signal S142. The driver 153 may generate signals SIG3A, SIG3B, and SIG3C on the basis of the signal S143.

FIG. 6 illustrates a configuration example of the driver 151. The drivers 152 and 153 may each have a configuration similar to that of the driver 151. The driver 151 may have drivers 151A, 151B, and 151C. The driver 151A may generate the signal SIG1A on the basis of the signals UPA, MDA, and DNA that are included in the signal S141. The driver 151B may generate the signal SIG1B on the basis of the signals UPB, MDB, and DNB. The driver 151C may generate the signal SIG1C on the basis of the signals UPC, MDC, and DNC.

Next, a configuration of the driver 151A is described in concrete terms. It is to be noted that the drivers 151B and 151C may each have a configuration similar to that of the driver 151A. The driver 151A may include an M-number of circuits VA (circuits UA1 to UAM), an M-number of circuits UB (circuits UB1 to UBM), an M-number of circuits DA (circuits DA1 to DAM), an M-number of circuits DB (circuits DB1 to DBM), and a transistor 95.

Each of the circuits UA1 to UAM and UB1 to UBM may have a transistor 91 and a resistor 92. In this example, the transistor 91 may be an N-channel MOS (Metal-Oxide Semiconductor) FET (Field-Effect Transistor). In each of the circuits UA1 to UAM and UB1 to UBM, the signal UPA may be supplied to a gate of the transistor 91; a voltage V1 may be supplied to a drain thereof; and a source thereof may be coupled to a first end of the resistor 92. Further, the first end of the resistor 92 may be coupled to the source of the transistor 91, and a second end thereof may be coupled to the output terminal Tout1A. A sum of an on-resistance of the transistor 91 and a resistance of the resistor 92 may be about "50×2M" Ω in this example.

Each of the circuits DA1 to DAM and DB1 to DBM may have a resistor 93 and a transistor 94. In this example, the transistor 94 may be an N-channel MOS FET. In each of the circuits DA1 to DAM and DB1 to DBM, a first end of the resistor 93 may be coupled to the output terminal Tout1A, and a second end thereof may be coupled to a drain of the transistor 94. Further, the signal DNA may be supplied to a gate of the transistor 94; a drain thereof may be coupled to the second end of the resistor 93; and a source thereof may be grounded. A sum of a resistance of the resistor 93 and an on-resistance of the transistor 94 may be about "50×2M" Ω in this example.

The transistor 95 may be an N-channel MOS FET in this example. The signal MDA may be supplied to a gate of the transistor 95; a drain thereof may be coupled to the output terminal Tout1A; and a signal Vdc having a voltage corresponding to the medium-level voltage VM may be supplied to a source thereof.

FIG. 7 illustrates an operation example of the driver controller 141 and the driver 151, The operation may be similar also in the driver controller 142 and the driver 152, as well as in the driver controller 143 and the driver 153. For example, when the symbol signals Tx1, Tx2, and Tx3 are "100", respectively, the driver controller 141 may determine that the symbol to be outputted is "+x", and may set the signals UPA, MDA, and DNA to "100" respectively, the signals UPB, MDB, and DNB to "001" respectively, and the signals UPC, MDC, and DNC to "010" respectively. In the driver 151A of the driver 151, this may turn on the transistor 91 in each of the circuits UA1 to UAM and UB1 to UBM. As a result, a voltage of the signal SIG1A may become the high-level voltage VH, and an output termination resistance (output impedance) of the driver 151A may become about 50Ω. Further, in the driver 151B of the driver 151, the transistor 94 in each of the circuits DA1 to DAM and DB1 to DBM may be turned on. As a result, a voltage of the signal SIG1B may become the low-level voltage VL, and an output termination resistance (output impedance) of the driver 151B may become about 50Ω. In addition, in the driver 151C of the driver 151, the transistor 95 may be turned on, and a voltage of the signal SIG1C may become the medium-level voltage VM. In such a manner, the driver 151 may generate the symbol "+x". This may apply to other symbols as well.

The voltage generator 16 (FIG. 1) may generate the signal Vdc having a voltage corresponding to the medium-level voltage VM.

FIG. 8 illustrates a configuration example of the voltage generator 16. The voltage generator 16 may have an M-number of circuits UC (circuits UC1 to UCM) and an M-number of circuits DC (circuits DC1 to DCM). The circuit UC may have a configuration similar to a configuration of each of the circuits UA and UB (FIG. 6) in the driver 151, and the circuit DC may have a configuration similar to a configuration of each of the circuits DA and DB (FIG. 6) in the driver 151. The voltage V1 may be supplied to a gate of a transistor 91 in each of the circuits UC1 to UCM and a gate of a transistor 94 in each of the circuits DC1 to DCM. This may turn on the transistor 91 in each of the circuits UC1 to UCM, and the transistor 94 in each of the circuits DC1 to DCM. A total resistance attributable to the circuits UC1 to UCM may be about 100Ω, and a total resistance attributable to the circuits DC1 to DCM may be about 100Ω. Therefore, in the voltage generator 16, a DC current IM may flow from a power source (voltage V1) toward a ground through the circuits UC1 to UCM and the circuits DC1 to DCM. In such a manner, the voltage generator 16 may generate the signal Vdc having a voltage corresponding to the medium-level voltage VM, and an output impedance of the voltage generator 16 may become about 50Ω.

Reception Device 30

The reception device 30 may include receivers 31, 32, and 33, and a processor 34, as illustrated in FIG. 1.

The receiver 31 may receive the signals SIG1A, SIG1B, and SIG1C, and may generate a reception signal S31 on the basis of these signals SIG1A, SIG1B, and SIG1C. The receiver 32 may receive the signals SIG2A, SIG2B, and SIG2C, and may generate a reception signal S32 on the basis of these signals SIG2A, SIG2B, and SIG2C. The receiver 33 may receive the signals SIG3A, SIG3B, and SIG3C, and may generate a reception signal S33 on the basis of these signals SIG3A, SIG3B, and SIG3C.

FIG. 9 illustrates a configuration example of the receiver 31. The receivers 32 and 33 may each have a configuration similar to that of the receiver 31. The receiver 31 may include resistors 41A, 41B, and 41C, switches 42A, 42B, and 42C, amplifiers 43A, 43B, and 43C, a clock generator 44, flip-flops (F/Fs) 45 and 46, and a signal generator 47.

The resistors 41A, 41B, and 41C may function as termination resistors in the lane LN1, and may each have a resistance of about 50Ω in this example. A first end of the resistor 41A may be coupled to the input terminal Tin1A, and be supplied with the signal SIG1A, while a second end thereof may be coupled to a first end of the switch 42A. A first end of the resistor 41B may be coupled to the input terminal Tin1B, and be supplied with the signal SIG1B, while a second end thereof may be coupled to a first end of the switch 42B. A first end of the resistor 41C may be coupled to the input terminal Tin1C, and be supplied with the signal SIG1C, while a second end thereof may be coupled to a first end of the switch 42C.

The first end of the switch 42A may be coupled to the second end of the resistor 41A, and a second end thereof may be coupled to second ends of the switches 42B and 42C. The first end of the switch 42B may be coupled to the second end of the resistor 41B, and the second end thereof may be coupled to the second ends of the switches 42A and 42C. The first end of the switch 42C may be coupled to the second end of the resistor 41C, and the second end thereof may be coupled to the second ends of the switches 42A and 42B. In the reception device 30, the switches 42A, 42B, and 42C may be set to an ON state, and the resistors 41A to 41C may function as termination resistors.

A positive input terminal of the amplifier 43A may be coupled to a negative input terminal of the amplifier 43C and the first end of the resistor 41A, and may be supplied with the signal SIG1A, while a negative input terminal thereof may be coupled to a positive input terminal of the amplifier 43B and the first end of the resistor 41B, and may be supplied with the signal SIG1B. The positive input terminal of the amplifier 43B may be coupled to the negative input terminal of the amplifier 43A and the first end of the resistor 41B, and may be supplied with the signal SIG1B, while a negative input terminal thereof may be coupled to a positive input terminal of the amplifier 43C and the first end of the resistor 41C, and may be supplied with the signal SIG1C. The positive input terminal of the amplifier 43C may be coupled to the negative input terminal of the amplifier 43B and the first end of the resistor 41C, and may be supplied with the signal SIG1C, and the negative input terminal thereof may be coupled to the positive input terminal of the amplifier 43A and the first end of the resistor 41A, and may be supplied with the signal SIG1A.

With such a configuration, the amplifier 43A may output a signal corresponding to a difference AB (SIG1A−SIG1B) between the signal SIG1A and the signal SIG1B; the amplifier 43B may output a signal corresponding to a difference BC (SIG1B−SIG1C) between the signal SIG1B and the signal SIG1C; and the amplifier 43C may output a signal corresponding to a difference CA (SIG1C−SIG1A) between the signal SIG1C and the signal SIG1A.

FIG. 10 illustrates an operation example of the amplifiers 43A, 43B, and 43C in a case where the receiver 31 receives the symbol "+x". It is to be noted that the switches 42A, 42B, and 42C remain in the ON state, and thus they are omitted in the illustration. In this example, a voltage of the signal SIG1A may be the high-level voltage VH; a voltage of the signal SIG1B may be the low-level voltage VL; and a voltage of the signal SIG1C may be the medium-level voltage VM. In this case, a current Iin may flow through the input terminal Tin1A, the resistor 41A, the resistor 41B, and the input terminal Tin1B in this order. Thereafter, since the high-level voltage VH and the low-level voltage VL are respectively provided to the positive input terminal and the negative input terminal of the amplifier 43A to cause the difference AB to be positive (AB>0), the amplifier 43A may output "1". Further, since the low-level voltage VL and the medium-level voltage VM are respectively provided to the positive input terminal and the negative input terminal of the amplifier 43B to cause the difference BC to be negative (BC<0), the amplifier 43B may output "0". In addition, since the medium-level voltage VM and the high-level voltage VH are respectively provided to the positive input terminal and the negative input terminal of the amplifier 43C to cause the difference CA to be negative (CA<0), the amplifier 43C may output "0".

The clock generator 44 may generate a clock signal RxCK on the basis of output signals of the amplifiers 43A, 43B, and 43C.

The flip-flop 45 may delay the output signals of the amplifiers 43A, 43B, and 43C by one clock cycle of the clock signal RxCK to output each of such delayed output signals. The flip-flop 46 may delay three output signals of the flip-flop 45 by one clock cycle of the clock signal RxCK to output each of such delayed output signals.

The signal generator 47 may generate transition signals RxF, RxR, and RxP on the basis of the output signals of the flip-flops 45 and 46, and the clock signal RxCK. The transition signals RxF, RxR, and RxP may correspond to the transition signals TxF9, TxR9, and TxP9 in the transmission device 10, respectively (FIG. 3), and may indicate symbol transition. The signal generator 47 may identify the symbol transition (FIG. 4) on the basis of a symbol indicated by the output signals of the flip-flop 45 and a symbol indicated by the output signals of the flip-flop 46 to generate the transition signals RxF, RxR, and RxP.

In such a manner, the receiver 31 may generate the transition signals RxF, RxR, and RxP, and the clock signal RxCK on the basis of the signals SIG1A, SIG1B, and SIG1C. Thereafter, the receiver 31 may output the transition signals RxF, RxR, and RxP, and the clock signal RxCK as the reception signal S31.

The processor 34 (FIG. 1) may perform predetermined processing operation on the basis of the reception signals S31, S32, and S33.

Here, the driver 151 corresponds to a specific but not limitative example of a "first transmitter" in one embodiment of the present disclosure. The driver 152 corresponds to a specific but not limitative example of a "second transmitter" in one embodiment of the present disclosure. The transistor 95 corresponds to a specific but not limitative example of a "switch" in one embodiment of the present disclosure. The voltage generator 16 corresponds to a specific but not limitative example of a "voltage generator" in one embodiment of the present disclosure.

Operation and Workings

Next, description is provided on operation and workings of the communication system 1 according to the present embodiment.

Overview of Overall Operation

First, an overview of overall operation of the communication system 1 is described with reference to FIGS. 1 and 3. The clock generator 11 of the transmission device 10 (FIG. 1) may generate the clock signal TxCK. The processor 12 may generate respective data to be transmitted using the lanes LN1, LN2, and LN3 by performing pre-determined processing operation. Thereafter, the processor 12 may provide the data to be transmitted using the lane LN1 to the transmission signal generator 131; may provide the data to be transmitted using the lane LN2 to the transmission signal generator 132; and may provide the data to be transmitted using the lane LN3 to the transmission signal generator 133. The transmission signal generator 131 may generate the transmission signal S131 on the basis of the data provided from the processor 12. The transmission signal generator 132 may generate the transmission signal S132 on the basis of the data provided from the processor 12. The transmission signal generator 133 may generate the transmission signal S133 on the basis of the data provided from the processor 12.

For example, in the transmission signal generator 131, the mapper 21 (FIG. 3) may generate the transition signals TxF0 to TxF6, TxR0 to TxR6, and TxP0 to TxP6 by performing predetermined mapping processing operation on the basis of the data provided from the processor 12, and the clock signal TxCK. The serializer 22F may generate the transition signal TxF9 on the basis of the transition signals TxF0 to TxF6 and the clock signal TxCK. The serializer 22R may generate the transition signal TxR9 on the basis of the transition signals TxR0 to TxR6 and the clock signal TxCK. The serializer 22P may generate the transition signal TxP9 on the basis of the transition signals TxP0 to TxP6 and the clock signal TxCK. The transmission symbol generator 23 may generate the symbol signals Tx1, Tx2, and Tx3 on the basis of the transition signals TxF9, TxR9, and TxP9, and the clock signal TxCK to output the resultant symbol signals Tx1, Tx2, and Tx3 as the transmission signals S131.

The driver controller 141 (FIG. 1) may generate the signal S141 on the basis of the transmission signal S131 and the clock signal TxCK. The driver controller 142 may generate the signal S142 on the basis of the transmission signal S132 and the clock signal TxCK. The driver controller 143 may generate the signal S143 on the basis of the transmission signal S133 and the clock signal TxCK. The voltage generator 16 may generate the signal Vdc having a voltage corresponding to the medium-level voltage VM. The driver 151 may generate the signals SIG1A, SIG1B, and SIG1C on the basis of the signal S141 and the signal Vdc. The driver 152 may generate the signals SIG2A, SIG2B, and SIG2C on the basis of the signal S142 and the signal Vdc. The driver 153 may generate the signals SIG3A, SIG3B, and SIG3C on the basis of the signal S143 and the signal Vdc.

In the reception device 30 (FIG. 1), the receiver 31 may generate the reception signal S31 on the basis of the signals SIG1A, SIG1B, and SIG1C; the receiver 32 may generate the reception signal S32 on the basis of the signals SIG2A, SIG2B, and SIG2C; and the receiver 33 may generate the reception signal S33 on the basis of the signals SIG3A, SIG3B, and SIG3C. The processor 34 may perform predetermined processing operation on the basis of the reception signals S31 to S33.

Detailed Operation

The voltage generator 16 may generate the signal Vdc having a voltage corresponding to the medium-level voltage VM. Thereafter, the driver 151 may generate the signals SIG1A, SIG1B, and SIG1C on the basis of the signal S141 and the signal Vdc; the driver 152 may generate the signals SIG2A, SIG2B, and SIG2C on the basis of the signal S142 and the signal Vdc; and the driver 153 may generate the signals SIG3A, SIG3B, and SIG3C on the basis of the signal S143 and the signal Vdc. Hereinafter, this operation is described in detail.

FIG. 11 illustrates an operation example of the driver 151 in outputting the symbol "+x". In FIG. 11, each of circuits indicated with solid lines among the circuits UA1 to UAM and UB1 to UBM represents a circuit in which the transistor 91 is in an ON state, and each of circuits indicated with dashed lines represents a circuit in which the transistor 91 is in an OFF state. Similarly, each of circuits indicated with solid lines among the circuits DA1 to DAM and DB1 to DBM represents a circuit in which the transistor 94 is in the ON state, and each of circuits indicated with dashed lines represents a circuit in which the transistor 94 is in the OFF state. It is to be noted that, in the voltage generator 16, each of the circuits UC is indicated with a solid line because the transistor 91 is in the ON state, and each of the circuits DC is indicated with a solid line because the transistor 94 is in the ON state. Further, each of the transistors 95 is illustrated with a switch indicating an operating state thereof.

In outputting the symbol "+x", the driver controller 141 may set the signals UPA, MDA, and DNA to "100" respectively, the signals UPB, MDB, and DNB to "001" respectively, and the signals UPC, MDC, and DNC to "010" respectively, as illustrated in FIG. 7.

As a result, in the driver 151A, the transistor 91 in each of the circuits UA1 to UAM and UB1 to UBM may turn on, while the transistor 94 in each of the circuits DA1 to DAM and DB1 to DBM may turn off, and the transistor 95 may turn off. Consequently, a voltage of the signal SIG1A may become the high-level voltage VH, and an output termination resistance (output impedance) of the driver 151A may become about 50Ω.

Further, in the driver 151B, the transistor 91 in each of the circuits UA1 to UAM and UB1 to UBM may be turned off, while the transistor 94 in each of the circuits DA1 to DAM and DB1 to DBM may be turned on, and the transistor 95 may be turned off. Consequently, a voltage of the signal SIG1B may become the low-level voltage VL, and an output termination resistance (output impedance) of the driver 151B may become about 50Ω.

In addition, in the driver 151C, the transistor 91 in each of the circuits UA1 to UAM and UB1 to UBM may be turned off, while the transistor 94 in each of the circuits DA1 to DAM and DB1 to DBM may be turned off, and the transistor 95 may be turned on. Consequently, in the driver 151C, the signal Vdc that is generated by the voltage generator 16 may be provided to the output terminal Tout1C, and a voltage of the output terminal Tout1C may be set to the medium-level voltage VM. Meanwhile, in the receiver 31 of the reception device 30, the high-level voltage VH may be applied to the first end of the resistor 41A, and the low-level voltage VH may be applied to the first end of the resistor 41B. Thus, a voltage (the medium-level voltage VM) that is divided by these resistors 41A and 41B may be provided to the input terminal Tin1C through the resistor 41C. In such a manner, a voltage of the output terminal Tout1C and a voltage of the input terminal Tin1C are almost equal to each other, and therefore a current may hardly flow through the line path 101C. In such a manner, a voltage of the signal SIG1C may become the medium-level voltage VM.

In the transmission device 10, the voltage generator 16 may provide the signal Vdc to not only the driver 151 but also the drivers 152 and 153, as illustrated in FIG. 1. In other words, in the transmission device 10, the single voltage generator 16 may be provided for the three drivers 151, 152, and 153. Therefore, when communication is performed in the communication system 1 using the three lanes LN1, LN2, and LN3, these three lanes LN1, LN2, and LN3 are likely to have an influence on one another.

FIG. 12 illustrates an example of an eye diagram in the lane LN1 in a case where the communication is performed using the three lanes LN1, LN2, and LN3. FIG. 12 illustrates eye diagrams of the difference AB between the signal SIG1A and the signal SIG1B, the difference BC between the signal SIG1B and the signal SIG1C, and the difference CA between the signal SIG1C and the signal SIG1A. As seen from the diagrams, even if the communication is performed using the three lanes LN1, LN2, and LN3, it is possible to assure sufficient eye apertures in the communication system 1, which makes it possible to suppress deterioration in waveform quality.

As described above, in the communication system 1, the single voltage generator 16 is provided for the three drivers 151, 152, and 153, which makes it possible to reduce power consumption while suppressing deterioration in the communication performance, as compared with a comparative example to be described below.

COMPARATIVE EXAMPLE

Next, description is provided on a communication system 1R according to a comparative example. In the communication system 1R, a method of generating the medium-level voltage VM may be different from the method in the communication system 1.

The communication system 1R includes a transmission device 10R and a reception device 30. The transmission device 10R is configured in such a manner that the voltage generator 16 is eliminated; the driver controllers 141, 142, and 143 are replaced with driver controllers 141R, 142R, and 143R, respectively; and the drivers 151, 152, and 153 are replaced with drivers 151R, 152R, and 153R, respectively in the transmission device 10 according to the present embodiment (FIG. 1).

The driver controller 141R generates a signal S141R on the basis of the transmission signal S131 and the clock signal TxCK. The driver controller 142R generates a signal S142R on the basis of the transmission signal S132 and the clock signal TxCK. The driver controller 143R generates a signal S143R on the basis of the transmission signal S133 and the clock signal TxCK. Each of the signals S141R, S142R, and S143R has twelve signals UPAA, UPAB, DNAA, DNAB, UPBA, UPBB, DNBA, DNBB, UPCA, UPCB, DNCA, and DNCB.

The driver 151R generates signals SIG1A, SIG1B, and SIG1C on the basis of the signal S141R. The driver 152R generates signals SIG2A, SIG2B, and SIG2C on the basis of the signal S142R. The driver 153B generates signals SIG3A, SIG3B, and SIG3C on the basis of the signal S143R.

FIG. 13 illustrates a configuration example of the driver 151R. The configuration is similar also in the drivers 152R and 153R. The driver 151R has drivers 151RA, 151RB, and 151RC. The driver 151RA generates the SIG1A on the basis of the signals UPAA, UPAB, DNAA, and DNAB that are included in the signal S141R. The driver 151RB generates the SIG1B on the basis of the signals UPBA, UPBB, DNBA, and DNBB. The driver 151RC generates the SIG1C on the basis of the signals UPCA, UPCB, DNCA, and DNCB.

The driver 151RA includes an M-number of circuits VA (circuits UA1 to UAM), an M-number of circuits UB (circuits UB1 to UBM), an M-number of circuits DA (circuits DA1 to DAM), and an M-number of circuits DB (circuits DB1 to DBM). The signal UPAA is supplied to a gate of a transistor 91 in each of the circuits UA1 to UAM, and the signal UPAB is supplied to a gate of a transistor 91 in each of the circuits UB1 to UBM. The signal DNAA is supplied to a gate of a transistor 94 in each of the circuits DA1 to DAM, and the signal DNAB is supplied to a gate of a transistor 94 in each of the circuits DB1 to DBM. This applies to the driver 151RB and the driver 151RC as well.

FIG. 14 illustrates an operation example of the driver 151R in outputting the symbol "+x". In outputting the symbol "+x.", the driver controller 141R may set the signals UPAA, UPAB, DNAA, and DNAB to "1100" respectively, the signals UPBA, UPBB, DNBA, and DNBB to "0011" respectively, and the signals UPCA, UPCB, DNCA, and DNCB to "1010" respectively, for example.

In the driver 151RA, the transistor 91 in each of the circuits UA1 to LAM and UB1 to UBM may be turned on, and the transistor 94 in each of the circuits DA1 to DAM and DB1 to DBM may be turned off. Consequently, a voltage of the signal SIG1A may become the high-level voltage VH, and an output termination resistance (output impedance) of the driver 151 RA may become about 50Ω. Further, in the driver 151RB, the transistor 91 in each of the circuits UA1 to UAM and UB1 to UBM may be turned off, and the transistor 94 in each of the circuits DA1 to DAM and DB1 to DBM may be turned on. Consequently, a voltage of the signal SIG1B may become the low-level voltage VL, and an output termination resistance (output impedance) of the driver 151RB may become about 50Ω. in addition, in the driver 151RC, the transistor 91 in each of the circuits UA1 to UAM and the transistor 94 in each of the circuits DA1 to DAM may be turned on, and the transistor 91 in each of the circuits UB1 to UBM and the transistor 94 in each of the circuits DB1 to DBM may be turned off. Consequently, a voltage of the signal SIG1C may become the medium-level voltage VM, and an output termination resistance (output impedance) of the driver 151RC may become about 50Ω.

At this time, in the driver 151RC, the transistor 91 in each of the circuits UA1 to UAM and the transistor 94 in each of the circuits DA1 to DAM may be turned on. In other words, an output terminal Tout1C of the driver 151RC may be pulled up by a resistor of about 100Ω, and be pulled down by a resistor of about 100Ω. Consequently, a DC current IM may flow through the driver 151RC via these two resistors. When the communication is performed using the three lanes LN1, LN2, and LN3, the DC current IM may flow through a single driver in the driver 151R; the DC current IM may flow through a single driver in the driver 152R; and the DC current IM may flow through a single driver in the driver 153R. This may result in an increase in power consumption.

On the contrary, in the communication system 1 according to the present embodiment, the single voltage generator 16 is provided for the three drivers 151, 152, and 153. This makes it possible to reduce power consumed by the DC current IM, and to reduce power consumption in the transmission device 10.

Effects

As described above, in the present embodiment, the single voltage generator is provided for a plurality of drivers, which makes it possible to reduce power consumption.

Modification Example 1-1

In the above--described embodiment, as illustrated in FIG. 8, the signal Vdc is generated by resistance voltage division; however, a method is not limited thereto. Alternatively, for example, like a voltage generator 16A illustrated in FIG. 15, the signal Vdc may be generated with use of a regulator. The voltage generator 16A may include a reference voltage generator 51, an operational amplifier 52, a capacitor 53, and a resistor 54. The reference voltage generator 51 may be configured to include, for example, a bandgap reference circuit, and may generate a reference voltage Vref corresponding to the medium-level voltage VM. The reference voltage Vref may be provided to a positive input terminal of the operational amplifier 52, and a negative input terminal thereof may be coupled to an output terminal thereof. With such a configuration, the operational amplifier 52 may operate as a voltage-follower to output the signal Vdc having a voltage corresponding to the medium-level voltage VM. Even when such a voltage generator 16A is used, it is similarly possible to assure sufficient eye apertures as illustrated in FIG. 16, which makes it possible to suppress deterioration in waveform quality.

Modification Example 1-2

In the above-described embodiment, the output impedance of the voltage generator 16 is set to about 50Ω; however, the present embodiment is not limited thereto. Alternatively, for example, the output impedance of the voltage generator may be sufficiently reduced, and a termination resistor of about 50Ω may be provided in each driver. Hereinafter, a communication system 1B according to the present modification example is described in detail.

The communication system 1B may include a transmission device 10B and the reception device 30. The transmission device 10B may have drivers 251, 252, and 253, and a voltage generator 16B.

FIG. 17 illustrates a configuration example of the driver 251. The drivers 252 and 253 may each have a configuration similar to that of the driver 251. The driver 251 may have drivers 251A, 251B, and 251C. The driver 251A may have a resistor 96. A first end of the resistor 96 may be coupled to the drain of the transistor 95, and a second end thereof may be coupled to the output terminal Tout1A. A resistance of the resistor 96 may be about 50Ω. This may apply to the drivers 251B and 251C as well.

FIG. 18 illustrates a configuration example of the voltage generator 16B. The voltage generator 16B may have resistors 55 and 56, and a capacitor 57. The voltage VI may be supplied to a first end of the resistor 55, and a second end thereof may be coupled to a first end of the resistor 56 and a first end of the capacitor 57. The first end of the resistor 56 may be coupled to the second end of the resistor 55 and the first end of the capacitor 57, and a second end thereof may be grounded. A resistance of each of the resistors 55 and 56 may be set to an equal value. Specifically, it may be possible to set the resistance of each of the resistors 55 and 56 to several kΩ, for example. The first end of the capacitor 57 may be coupled to the second end of the resistor 55 and the first end of the resistor 56, and the second end thereof may be grounded. With such a configuration, the voltage generator 16B makes it possible to generate the signal Vdc having a voltage corresponding to the medium-level voltage VM, as well as to reduce an output impedance of the voltage generator 16B in a frequency range of signals to be transmitted by the communication system 1B.

The communication system 1B makes it possible to reduce the amount of the DC current IM in the voltage generator 16B, which allows for reduction in power consumption. Further, each of the drivers 251A, 251B, and 251C has the resistor 96, and therefore even if the communication is performed using, for example, the three lanes LN1, LN2, and LN3, it is possible to enhance the isolation of the lanes from one. another, which allows for improvement in waveform quality.

In addition, the voltage generator 16B (FIG. 18) is used in this example; however, a configuration is not limited thereto. As an alternative, for example, a voltage generator 16C illustrated in FIG. 19 may be used. The voltage generator 16C may include the reference voltage generator 51, the operational amplifier 52, and a capacitor 53. In other words, the voltage generator 16C may be equivalent to the voltage generator 16A (FIG. 15) from which the resistor 54 is omitted.

Second Embodiment

Next, description is provided on communication systems 2A and 2B according to a second embodiment. The present embodiment may use a transmission device having an operation mode of performing communication with use of a signal having three voltage levels and an operation mode of performing communication with use of a differential signal. It is to be noted that any component parts essentially same as those in the communication system 1 according to the above-described first embodiment are denoted with the same reference numerals, and the related descriptions are omitted as appropriate.

FIG. 20A illustrates a configuration example of the communication system 2A according to the present embodiment. FIG. 20B illustrates a configuration example of the communication system 2B according to the present embodiment. The communication system 2A may include a transmission device 60, a transmission line 100, and a reception device 30. The communication system 2A may perform communication with use of a signal having three voltage levels. The communication system 2B may include the transmission device 60, the transmission line 110, and the reception device 70. The communication system 2B may perform communication with use of a differential signal. The transmission device 60 may have two operation modes MA and MB. The transmission device 60 may operate in the operation mode MA when the transmission device 60 is applied to the communication system 2A, and may operate in the operation mode MB when the transmission device 60 is applied to the communication system 2B.

The communication system 2A (FIG. 20A) may operate in a manner similar to the communication system 1 according to the above-described embodiment. In other words, the communication system 2A may use the lane LN1 to transmit the signal SIG1A through the line path 101A; to transmit the signal SIG1B through the line path 101B; and to transmit the signal SIG1C through the line path 101C. Similarly, the communication system 2A may use the lane LN2 to transmit the signal SIG2A through the line path 102A; to transmit the signal SIG2B through the line path 102B; and to transmit the signal SIG2C through the line path 102C. Further, the communication system 2A may use the lane LN3 to transmit the signal SIG3A through the line path 103A; to transmit the signal SIG3B through the line path 103B; and to transmit the signal SIG3C through the line path 103C.

In the communication system 2B (FIG. 20B), the transmission line 110 may have line paths 111P and 111N, line paths 112P and 112N, line paths 113P and 113N, and line paths 114P and 114N. The reception device 70 may have input terminals Tin1P and Tin1N, input terminals Tin2P and Tin2N, input terminals Tin3P and Tin3N, and input terminals Tin4P and Tin4N. An output terminal Tout1A of the transmission device 60 and the input terminal Tin1P of the reception device 70 may be coupled to each other through the line path 111P, and an output terminal Tout1B of the transmission device 60 and the input terminal Tin1N of the reception device 70 may be coupled to each other through the line path 111N. Similarly, an output terminal Tout1C of the transmission device 60 and the input terminal Tin2P of the reception device 70 may be coupled to each other through the line path 112P, and an output terminal Tout2A of the transmission device 60 and the input terminal Tin2N of the reception device 70 may be coupled to each other through the line path 112N. Further, an output terminal Tout2B of the transmission device 60 and the input terminal Tin3P of the reception device 70 may be coupled to each other through the line path 113P, and an output terminal Tout2C of the transmission device 60 and the input terminal Tin3N of the reception device 70 may be coupled to each other through the line path 113N. In addition, an output terminal Tout3A of the transmission device 60 and the input terminal Tin4P of the reception device 70 may be coupled to each other through the line path 114P, and an output terminal Tout3B of the transmission device 60 and the input terminal Tin4N of the reception device 70 may be coupled to each other through the line path 114N. A characteristic impedance of each of the line paths 111P, 111N, 112P, 112N, 113P, 113N, 114P, and 114N may be about 50Ω in this example.

The line, paths 111P and 111N may configure a lane LN11; the line paths 112P and 112N may configure a lane LN12; the line paths 113P and 113N may configure a lane LN13; and the line paths 114P and 114N may configure a lane LN14. The communication system 2B may use the lane LN11 to transmit a signal SIG1P through the line path 111P, and to transmit a signal SIG1N through the line path 111N. Similarly, the communication system 2B may use the lane LN12 to transmit a signal SIG2P through the line path 112P, and to transmit a signal SIG2N through the line path 112N. Further, the communication system 2B may use the lane LN13 to transmit a signal SIG3P through the line path 113P, and to transmit a signal SIG3N through the line path 113N. In addition, the communication system 2B may use the lane LN14 to transmit a signal SIG4P through the line path 114P, and to transmit a signal SIG4N through the line path 114N. The signals SIG1P and SIG1N may configure a differential signal; the signals SIG2P and SIG2N may configure a differential signal; the signals SIG3P and SIG3N may configure a differential signal; and the signals SIG4P and SIG4N may configure a differential signal.

Transmission Device 60

FIG. 21 illustrates a configuration example of the transmission device 60. The transmission device 60 may include a processor 62, transmission signal generators 181 to 184, and selectors 191 to 199.

The processor 62 may generate data to be transmitted by performing predetermined processing operation. Further, the processor 62 may select one of the two operation modes MA and MB, and may control the transmission device 60 to operate in the selected operation mode. Specifically, when the transmission device 60 is applied to the communication system 2A (FIG. 20A), the processor 62 may select the operation mode MA to set a signal SET to "1", and may generate respective data to be transmitted using the lanes LN1, LN2, and LN3. Thereafter, the processor 62 may provide data to be transmitted using the lane LN1 to the transmission signal generator 131; may provide data to be transmitted using the lane LN2 to the transmission signal generator 132; and may provide data to be transmitted using the lane LN3 to the transmission signal generator 133. Alternatively, when the transmission device 60 is applied to the communication system 2B (FIG. 20B), the processor 62 may select the operation mode MB to set the signal SET to "0", and may generate respective data to be transmitted using the lanes LN11, LN12, LN13, and LN14. Thereafter, the processor 62 may provide data to be transmitted using the lane LN11 to the transmission signal generator 181; may provide data to be transmitted using the lane LN12 to the transmission signal generator 182; may provide data to be transmitted using the lane LN13 to the transmission signal generator 183, and may provide data to be transmitted using the lane LN14 to the transmission signal generator 184.

The transmission signal generator 181 may generate a transmission signal S181 on the basis of the data provided from the processor 62 and the clock signal TxCK. The transmission signal generator 182 may generate a transmission signal S182 on the basis of the data provided from the processor 62 and the clock signal TxCK. The transmission signal generator 183 may generate a transmission signal S183 on the basis of the data provided from the processor 62 and the clock signal TxCK. The transmission signal generator 184 may generate a transmission signal S184 on the basis of the data provided from the processor 62 and the clock signal TxCK.

FIG. 22 illustrates a configuration example of the transmission signal generator 181. The transmission signal generators 182 to 184 may each have a configuration similar to that of the transmission signal generator 181. The transmission signal generator 181 may have a pattern generator 63, a selector 64, and a serializer 65.

The pattern generator 63 may generate a data pattern to be used in performing deskew of the lanes LN11 to LN14 in, for example, the communication system 2B (FIG. 20B) on the basis of the clock signal TxCK.

The selector 64 may select one of the data provided from the processor 62 and the data generated by the pattern generator 63 on the basis of, for example, a control signal (not illustrated) that is provided from the processor 62 to output the selected data as a signal S64.

The serializer 65 may serialize data (a parallel signal) that is provided from the selector 64 on the basis of the clock signal TxCK, thereby generating a signal S181. The signal S181 may include signals UP and DN that are inverted to each other.

Each of selectors 191 to 199 (FIG. 21) may control operation of each of the drivers 151 to 153 on the basis of the signal SEL, and the signals S141 to S143 and S181 to S184.

FIG. 23 illustrates an operation example of each of the selectors 191 to 199.

When the signal SEL is "1" (operation mode MA), the selector 191 may output the signal UPA included in the signal S141 as a signal UP1; may output the signal MDA as a signal MD1 and may output the signal DNA as a signal DN1. The driver 151A may generate the signal SIG1A on the basis of the signals UP1, MD1, and DN1. For example, when the signal MD1 is "1", the transistor 95 in the driver 151A may turn on, thereby setting the voltage of signal SIG1A to the medium-level voltage VM, as with the above-described first embodiment.

Alternatively, when the signal SEL is "0" (operation mode MB), the selector 191 may output the signal UP included in the signal S181 as the signal UP1; may output the signal DN as the signal DN1; and may set the signal MD1 to "0" (low level). The driver 151A may generate the signal SIG1P on the basis of the signals UP1, MD1, and DN1. As a result, in the operation mode MB, the transistor 95 in the driver 151A may remain in the OFF state.

Further, when the signal SEL is "1" (operation mode MA), the selector 192 may output a signal UPB included in the signal S141 as a signal UP2; may output a signal MDB as a signal MD2; and may output the signal DNB as a signal DN2. The driver 151E may generate the signal SIG1B on the basis of the signals UP2, MD2, and DN2. Alternatively, when the signal SEL is "0" (operation mode MB), the selector 192 may output the signal DN included in the signal S181 as the signal UP2; may output the signal UP as the signal DN2; and may set the signal MD2 to "0" (low level). The driver 151B may generate the signal SIG1N on the basis of the signals UP2, MD2, and DN2.

Moreover, when the signal SEL is "1" (operation mode MA), the selector 193 may output the signal UPC included in the signal S141 as a signal UP3; may output the signal MDC as a signal MD3; and may output the signal DNC as a signal DN3. The driver 151C may generate the signal SIG1C on the basis of the signals UP3, MD3, and DN3. Alternatively, when the signal SEL is "0" (operation mode MB), the selector 193 may output the signal UP included in the signal S182 as the signal UP3; may output the signal DN as the signal DN3; and may set the signal MD3 to "0" (low level). The driver 151C may generate the signal SIG2P on the basis of the signals UP3, MD3, and DN3.

In addition, when the signal SEL is "1" (operation mode MA), the selector 194 may output a signal UPA included in the signal S142 as a signal UP4; may output a signal MDA as a signal MD4; and may output the signal DNA as a signal DN4. A driver 152A may generate the signal SIG2A on the basis of the signals UP4, MD4, and DN4. Alternatively, when the signal SEL is "0" (operation mode MB), the selector 194 may output the signal DN included in the signal S182 as the signal UP4; may output the signal UP as the signal DN4; and may set the signal MD4 to "0" (low level). The driver 152A may generate the signal SIG2N on the basis of the signals UP4, MD4, and DN4.

Further, when the signal SEL is "1" (operation mode MA), the selector 195 may output the signal UPB included in the signal S142 as a signal UP5; may output a signal MDB as a signal MD5; and may output the signal DNB as a signal DN5. A driver 152B may generate the signal SIG2B on the basis of the signals UP5, MD5, and DN5. Alternatively, when the signal SEL is "0" (operation mode MB), the selector 195 may output the signal UP included in the signal S183 as the signal UP5; may output the signal DN as the signal DN5; and may set the signal MD5 to "0" (low level). The driver 152B may generate the signal SIG3P on the basis of the signals UP5, MD5, and DN5.

Moreover, when the signal SEL is "1" (operation mode MA), the selector 196 may output the signal UPC included in the signal S142 as a signal UP6; may output the signal MDC as a signal MD6; and may output the signal DNC as a signal DN6. A driver 152C may generate the signal SIG2C on the basis of the signals UP6, MD6, and DN6. Alternatively, when the signal SEL is "0" (operation mode MB), the selector 196 may output the signal DN included in the signal S183 as the signal UP6; may output the signal UP as the signal DN6; and may set the signal MD6 to "0" (low level). The driver 152C may generate the signal SIG3N on the basis of the signals UP6, MD6, and DN6.

In addition, when the signal SEL is "1" (operation mode MA), the selector 197 may output the signal UPA included in the signal S143 as a signal UP7; may output the signal MDA as a signal MD7; and may output the signal DNA as a signal DN7. A driver 153A may generate the signal SIG3A on the basis of the signals UP7, MD7, and DN7. Alternatively, when the signal SEL is "0" (operation mode MB), the selector 197 may output the signal UP included in the signal S184 as the signal UP7; may output the signal DN as the signal DN7; and may set the signal MD7 to "0" (low level). The driver 153A may generate the signal SIG4P on the basis of the signals UP7, MD7, and DN7.

Further, when the signal SEL is "1" (operation mode MA), the selector 198 may output the signal UPB included in the signal S143 as a signal UP8; may output the signal MDB as a signal MD8; and may output the signal DNB as a signal DN8. A driver 153B may generate the signal SIG3B on the basis of the signals UP8, MD8, and DN8. Alternatively, when the signal SEM is "0" (operation mode MB), the selector 198 may output the signal DN included in the signal S184 as the signal UP8; may output the signal UP as the signal DN8; and may set the signal MD8 to "0" (low level). The driver 153B may generate the signal SIG4N on the basis of the signals UP8, MD8, and DN8.

Moreover, when the signal SEL is "1" (operation mode MA), the selector 199 may output the signal UPC included in the signal S143 as a signal UP9; may output the signal MDC as a signal MD9; and may output the signal DNC as a signal DN9. A driver 153C may generate the signal SIG3C on the basis of the signals UP9, MD9, and DN9. Alternatively, when the signal SEL is "0" (operation mode MB), the selector 199 may set each of the signals UP9, MD9, and DN9 to "0" (low level).

Reception Device 70

As illustrated in FIG. 20B, the reception device 70 may include receivers 71, 72, 73, and 74, and a processor 75.

The receiver 71 may receive the signals SIG1P and SIG1N, and may generate a reception signal S71 on the basis of these signals SIG1P and SIG1N. The receiver 72 may receive the signals SIG2P and SIG2N, and may generate a reception signal S72 on the basis of these signals SIG2P and SIG2N. The receiver 73 may receive the signals SIG3P and SIG3N, and may generate a reception signal S73 on the basis of these signals SIG3P and SIG3N. The receiver 74 may receive the signals SIG4P and SIG4N, and may generate a reception signal S74 on the basis of these signals SIG4P and SIG4N.

FIG. 24 illustrates a configuration example of the receiver 71. The receivers 72 to 74 may each have a configuration similar to that of the receiver 71. The receiver 71 may include a resistor 81, an amplifier 82, a clock generator 83, and a flip-flop (F/F) 84.

The resistor 81 may function as a termination resistor in the lane LN11, and may have a resistance of about 100Ω in this example. A first end of the resistor 81 may be coupled to the input terminal Tin1P, and be supplied with the signal SIG1P, while a second end thereof may be coupled to the input terminal Tin1N, and be supplied with the signal SIG1N.

A positive input terminal of the amplifier 82 may be coupled to the first end of the resistor 81, and be supplied with the signal SIG1P, while a negative input terminal thereof may be coupled to the second end of the resistor 81, and be supplied with the signal SIG1N.

The clock generator 83 may generate the clock signal RxCK on the basis of an output signal of the amplifier 82. The flip-flop 84 may sample the output signal of the amplifier 82 at a transition timing of the clock signal RxCK to output a sampling result as a data signal RxD.

In such a manner, the receiver 71 may generate the data signal RxD and the clock signal RxCK on the basis of the signals SIG1P and SIG1N. Thereafter, the receiver 71 may output the data signal RxD and the clock signal RxCK as the reception signal S71.

The processor 75 (FIG. 20B) may perform predetermined processing operation on the basis of the reception signals S71 to S74.

As described above, in the present embodiment, a plurality of operation modes (two operation modes M1 and M2 in this example) are provided, which makes it possible to achieve various interfaces.

3. APPLICATION EXAMPLES

Next, description is provided on application examples of the communication system explained in any of the above-described embodiments and modification examples thereof.

Application Example 1

FIG. 25 illustrates an external appearance of a smartphone 300 (multifunctional mobile phone) to which the communication system according to any of the above-described embodiments and the modification examples thereof is applied. A variety of devices are built into this smartphone 300, and the communication system according to any of the above-described embodiments and the modification examples thereof is applied to a communication system that exchanges data between these devices.

FIG. 26 illustrates a configuration example of an application processor 310 used in the smartphone 300. The application processor 310 has a CPU (Central Processing Unit) 311, a memory controller 312, a power source controller 313, an external interface 314, a GPU (Graphics Processing Unit) 315, a media processing controller 316, a display controller 317, and an MIPI (Mobile Industry Processor Interface) interface 318. In this example, the CPU 311, the memory controller 312, the power source controller 313, the external interface 314, the GPU 315, the media processor 316, and the display controller 317 are coupled to a system bus 319 to allow for data exchange therebetween via this system bus 319.

The CPU 311 may process various information to be handled in the smartphone 300 in accordance with a program. The memory controller 312 may control a memory 501 to be used when the CPU 311 performs information processing operation. The power source controller 313 may control a power source of the smartphone 300.

The external interface 314 is an interface for communication with external devices, and may be coupled to a wireless communication section 502 and an image sensor 410 in this example. The wireless communication section 502 may perform wireless communication with mobile phone base stations, and may include, for example, a baseband section and an RF (Radio Frequency) front-end section. The image sensor 410 may acquire an image, and may include, for example, a CMOS sensor.

The GPU 315 may perform image processing operation. The media processor 316 processes information such as voice, characters, and graphics. The display controller 317 controls a display 504 via the MIDI interface 318. The interface 318 transmits an image signal to the display 504. As such an image signal, for example, a YUV-format signal, a RGB-format signal, or any other format signal may be used. The MIPI interface 318 may operate on the basis of a reference clock to be provided from an oscillator circuit 330 including, for example, a crystal oscillator. For example, the communication system according to any of the above-described embodiments and the modification examples thereof may be applied to a communication system between the MIPI interface 318 and the display 504.

FIG. 27 illustrates a configuration example of the image sensor 410. The image sensor 410 has a sensor 411, an ISP (Image Signal Processor) 412, a JPEG (Joint Photographic Experts Group) encoder 413, a CPU 414, a RAM (Random Access Memory) 415, a ROM (Read Only Memory) 416, a power source controller 417, an I²C (Inter-Integrated Circuit) interface 418, and an MIPI interface 419. In this example, each of these blocks may be coupled to a system bus 420 to allow for data exchange between these blocks via this system bus 420.

The sensor 411 may acquire an image, and may include, for example, a CMOS sensor. The ISP 412 may perform predetermined processing operation for the image acquired by the sensor 411. The JPEG encoder 413 may encode the image processed by the ISP 412 to generate a JPEG-format image. The CPU 414 may control each block of the image sensor 410 in accordance with a program. The RAM 415 may be a memory to be used when the CPU 414 performs information processing operation. The ROM 416 may store a program to be executed in the CPU 414, and a setting value obtained by calibration. The power source controller 417 may control a power source of the image sensor 410. The I²C interface 418 may receive a control signal from the application processor 310. Although not illustrated, the image sensor 410 may also receive a clock signal from the application processor 310 in addition to the control signal. Specifically, image sensor 410 may be configured to be operable on the basis of clock signals of various frequencies. The MIPI interface 419 may transmit an image signal to the application processor 310. As such an image signal, for example, a YUV-format signal, a RGB-format signal, or any other format signal may be used. The MIPI interface 419 may operate on the basis of a reference clock to be provided from an oscillator circuit 430 including, for example, a crystal oscillator. For example, the communication system according to any of the above-described embodiments and the modification examples thereof may be applied to a communication system between the MIPI interface 419 and the application processor 310.

Application Example 2

FIG. 28 illustrates a configuration example of a vehicle control system 600 to which the communication system according to any of the above-described embodiments and the modification examples thereof is applied. The vehicle control system 600 may control operation of an automobile, an electric vehicle, an electric hybrid vehicle, a motorcycle, and any other vehicle. The vehicle control system 600 may have a drive-line control unit 610, a body-line control unit 620, a battery control unit 630, an out-vehicle information detector unit 640, an in-vehicle information detector unit 650, and an integrated control unit 660. These units are coupled to one another through a communication network 690. As the communication network 690, a network in conformity to any standards such as CAN (Controller Area Network), LIN (Local Interconnect Network), LAN (Local Area Network), and FlexRay (registered trademark) may be usable. Each of those units may include, for example, a microcomputer, a storage section, a drive circuit that drives a device to be controlled, a communication interface, or any other component.

The drive-line control unit 610 may control operation of units associated with a drive line of a vehicle. A vehicle state detector 611 may be coupled to the drive-line control unit 610. The vehicle state detector 611 may detect a state of the vehicle, and may include, for example, a gyro-sensor, an acceleration sensor, a sensor that detects the amount of operation of an accelerator pedal or a brake pedal, and a steering angle, and any other sensor. The drive-line control unit 610 may control operation of the units associated with the drive line of the vehicle on the basis of information detected by the vehicle state detector 611. For example, the communication system according to any of the above-described embodiments and the modification examples thereof may be applied to a communication system between the drive-line control unit 610 and the vehicle state detector 611.

The body-line control unit 620 may control operation of various units provided in the vehicle, such as a keyless entry system, a power window unit, and a variety of lamps.

The battery control unit 630 may control a battery 631. The battery 631 may be coupled to the battery control unit 630. The battery 631 may supply electric power to a drive motor, and may include, for example, a secondary battery, a cooler, or any other component. The battery control unit 630 obtains information such as temperature, an output voltage, and a remaining amount of battery, and may control the cooler or any other component of the battery 631 on the basis of such information. For example, the communication system according to any of the above-described embodiments and the modification examples thereof may be applied to a communication system between the battery control unit 630 and the battery 631.

The out-vehicle information detector unit 640 may detect information on the outside of the vehicle. An imaging section 641 and an out-vehicle information detector 642 may be coupled to the out-vehicle information detector unit 640. The imaging section 641 may take an image outside the vehicle, and may include, for example, a ToF (Time of Flight) camera, a stereo camera, a monocular camera, an infrared camera, or any other camera. The out-vehicle information detector 642 may detect information on the outside of the vehicle, and may include, for example, a sensor that detects climate or weather, a sensor that detects other vehicles, obstacles, and pedestrians, etc. on the periphery of the vehicle, or any other sensor. The out-vehicle information detector unit 640 may recognize, for example, climate, weather, a road-surface condition, or any other status on the basis of an image acquired by the imaging section 641, or information detected by the out-vehicle information detector 642. Thereafter, the out-vehicle information detector unit 640 may detect objects such as other vehicles on the periphery of the vehicle, obstacles, pedestrians, traffic signs, and characters marked on a road surface, etc., or may detect a distance between each of such objects and the vehicle. For example, the communication system according to any of the above-described embodiments and the modification examples thereof may be applied to a communication system between the out-vehicle information detector unit 640 and each of the imaging section 641 and an out-vehicle information. detector 642.

The in-vehicle information detector unit 650 may detect information on the inside of the vehicle. A driver state detector 651 may be coupled to the in-vehicle information detector unit 650. The driver state detector 651 may detect a state of a driver, and may include, for example, a camera, a biological sensor, a microphone, or any other component. The in-vehicle information detector unit 650 may monitor, for example, a fatigue degree of the driver, a concentration degree of the driver, and whether the driver is dozing on the basis of information detected by the driver state detector 651. For example, the communication system according to any of the above-described embodiments and the modification examples thereof may be applied to a communication system between the in-vehicle information detector unit 650 and the driver state detector 651.

The integrated control unit 660 may control operation of the vehicle control system 600. An operating section 661, a display 662, and an instrument panel 663 may be coupled to the integrated control unit 660. The operating section 661 may be manipulated by a passenger, and may include, for example, a touch panel, various buttons, and various switches. The display 662 may display an image, and may include, for example, a liquid crystal display panel, or any other panel. The instrument panel 663 may display a vehicle state, and may include, for example, meters such as a speed meter, and various alarm lamps. For example, the communication system according to any of the above-described embodiments and the modification examples thereof may be applied to a communication system between the integrated control unit 660 and each of the operating section 661, the display 662, and the instrument panel 663.

The technology is described thus far with reference to some embodiments and modification examples, as well as application examples; however, the technology is not limited thereto, and may be modified in a variety of ways.

For example, in each of the above-described embodiments, the technology is applied to the communication system that performs communication using signals each having three voltage levels; however, the application is not limited thereto. As an alternative, for example, the technology may be applied to a communication system that performs communication using signals each having four or more voltage levels.

It is to be noted that effects described herein are merely exemplified and not limitative, and effects of the present disclosure may be other effects or may further include other effects.

It is to be noted that the present technology may be configured as follows.

(1)

A transmission device including:

a first transmitter that has a plurality of drivers that each enable transmission of a signal using a plurality of voltages including a first voltage, a second voltage, and a third voltage between the first voltage and the second voltage, and that transmits a sequence of symbols;

a second transmitter that has a plurality of drivers that each enable transmission of a signal using the plurality of voltages, and that transmits a sequence of symbols; and a voltage generator that generates the third voltage, wherein each of the drivers of the first transmitter and the drivers of the second transmitter has a switch that transmits the third voltage generated by the voltage generator to an output terminal of the driver through turn-on operation of the switch.

(2)

The transmission device according to (1), wherein the drivers of the first transmitter include a first driver, a second driver, and a third driver, and each of the first driver, the second driver, and the third driver performs first operation of setting a voltage at its output terminal to a voltage that is different from one another and is one of the first voltage, the second voltage, and the third voltage, (3)

The transmission device according to (2), wherein the transmission device has a first operation mode and a second operation mode, and the first driver, the second driver, and the third driver perform the first operation in the first operation mode.

(4)

The transmission device according to (3), wherein each of the first driver and the second driver performs second operation of setting a voltage at its output terminal to a voltage that is different from each other and is one of the first voltage and the second voltage in the second operation mode.

(5)

The transmission device according to (4), wherein the drivers of the second transmitter include a fourth driver, a fifth driver, and a sixth driver, the fourth driver, the fifth driver, and the sixth driver perform the first operation in the first operation mode, the third driver and the fourth driver perform the second operation in the second operation mode, and the fifth driver and the sixth driver perform the second operation in the second operation mode.

(6)

The transmission device according to any one of (1) to (5), wherein the voltage. generator has an output impedance corresponding to a line impedance of a transmission line coupled to the transmission device.

(7)

The transmission device according to any one of (1) to (6), wherein each of drivers of the first transmitter and the drivers of the second transmitter has a resistor, and in each of the drivers of the first transmitter and the drivers of the second transmitter, the switch transmits the third voltage generated by the voltage generator to the output terminal of the driver via the resistor through turn-on operation of the switch.

(8)

The transmission device according to (7), wherein the resistor has a resistance corresponding to a line impedance of a transmission line coupled to the transmission device.

(9)

The transmission device according to any one of (1) to (8), wherein the voltage generator has a plurality of resistors that are provided on a path between a first power source corresponding to the first voltage and a second power source corresponding to the second voltage.

(10)

The transmission device according to any one of (1) to (8), wherein the voltage generator has a regulator that generates the third voltage.

(11)

A communication system provided with a transmission device and a reception device, the transmission device including:

a first transmitter that has a plurality of drivers that each enable transmission of a signal using a plurality of voltages including a first voltage, a second voltage, and a third voltage between the first voltage and the second voltage, and that transmits a sequence of symbols;

a second transmitter that has a plurality of drivers that each enable transmission of a signal using the plurality of voltages, and that transmits a sequence of symbols; and a voltage generator that generates the third voltage, wherein each of the drivers of the first transmitter and the drivers of the second transmitter has a switch that transmits the third voltage generated by the voltage generator to an output terminal of the driver through turn-on operation of the switch.

It should be understood by those skilled in the art that various modifications, combinations, sub-combinations, and alterations may occur depending on design requirements and other factors insofar as they are within the scope of the appended claims or the equivalents thereof.

REFERENCE SIGNS LIST 1, 2A, 2B communication system
10, 60 transmission device
11 clock generator
12 processor
16, 16A, 16B, 16C voltage generator
21 mapper
22F, 22R, 22P serializer
23 transmission symbol generator
24 signal generator
25 flip-flop
30, 70 reception device
31 to 33 receiver
34 processor
41A, 41B, 41C resistor
47A, 42B, 42C switch
43A, 43B, 43C amplifier
44 clock generator
45, 46 flip-flop
47 signal generator
51 reference voltage generator
52 operational amplifier
53 capacitor
54 resistor
55, 56 resistor
57 capacitor
62 processor
63 pattern generator
64 selector
65 serializer
71 to 74 receiver
75 processor
81 resistor
82 amplifier
83 clock generator
84 flip-flop
91, 94, 95 transistor
92, 93, 96 resistor
100 transmission line
101A, 101B, 101C, 102A, 102B, 102C, 103A, 103B, 103C line path
110 transmission line
111P, 111N, 112P, 112N, 113P, 113N, 114P, 114N line path
131 to 133 transmission signal generator
141 to 143 driver controller
151 to 153, 251 to 253 driver
151A, 151B, 151C, 152A, 152B, 152C, 153A, 153B, 153C, 251A, 251B, 251C, 252A, 252B, 252C, 253A, 253B, 253C driver
181 to 184 transmission signal generator
191 to 199 selector
DS, DN symbol
D1 to D3, Tx1 to Tx3 symbol signal
LN1 to LN3, LN11 to LN14 lane
S31 to S33, S71 to S74 reception signal
S64 signal
S131 to S133 transmission signal
S141 to S143, S181 to S184 signal
SIG1A, SIG1B, SIG1C, SIG2A, SIG2B, SIG2C, SIG3A, SIG3B, SIG3C signal
Tin1A, Tin1B, Tin1C, Tin1P, Tin1N, Tin2A, Tin2B, Tin2C, Tin2P, Tin2N, Tin3A, Tin3B, Tin3C, Tin3P, Tin3N input terminal
Tout1A, Tout1B, Tout1C, Tout2A, Tout2B, Tout2C, Tout3A, Tout3B, Tout3C output terminal
TxF0 to TxF6, TxF9, TxR0 to TxR6, TxR9, TxP0 to TxP6, TxP9, RxF, RxR, RxP transition signal
SEL signal
TxCK, RxCK clock signal
UA1 to UAM, UB1 to UBM, UC1 to UCM, DA1 to DAM, DB1 to DPM, DC1 to DCM circuit
UPA, MDA, DNA, UPB, MDB, DNB UPC, MDC, DNC
UP1 to UP9, MD1 to MD9, DN1 to DN9 signal
Vdc signal
VH high-level voltage
VL low-level voltage
VM medium-level voltage
Vref reference voltage

The invention claimed is:

1. A transmission device comprising:
a first transmitter including a first plurality of drivers that are configured to transmit a first sequence of symbols, each symbol of the first sequence of symbols using a first voltage having a first voltage level, a second voltage having a second voltage level, and a third voltage having a third voltage level, the first voltage level being between the second voltage level and the third voltage level;
a second transmitter including a second plurality of drivers that are configured to transmit a second sequence of symbols, each symbol of the second sequence of symbols using a fourth voltage having a fourth voltage level, a fifth voltage having a fifth voltage level, and a sixth voltage having a sixth voltage level, the fourth voltage level being between the fifth voltage level and the sixth voltage level; and
a common voltage generator electrically connected to the first plurality of drivers and the second plurality of drivers, the common voltage generator configured to generate and provide the first voltage to the first plurality of drivers and the fourth voltage to the second plurality of drivers, wherein
each of the first plurality of drivers includes a switch that is configured transmit the first voltage that has been provided by the common voltage generator to an output terminal of the each of the first plurality of drivers, and
each of the second plurality of drivers includes a switch that is configured transmit the fourth voltage that has been provided by the common voltage generator to an output terminal of the each of the second plurality of drivers, wherein
the first voltage and the fourth voltage are substantially similar and share a common node,
the common voltage generator has a first output impedance between the common voltage generator and the first plurality of drivers,
the common voltage generator has a second output impedance between the common voltage generator and the second plurality of drivers, and
the first output impedance matches the second output impedance.

2. The transmission device according to claim 1, wherein the first plurality of drivers of the first transmitter include a first driver, a second driver, and a third driver, and the first driver, the second driver, and the third driver are configured to perform a first operation of setting a first set of voltages at output terminals of the first plurality of drivers, each of the first set of voltages being different from each other, and the first set of voltages including the first voltage, the second voltage, and the third voltage.

3. The transmission device according to claim 1, wherein each of the first output impedance and the second output impedance corresponds to a line impedance of a transmission line coupled to the transmission device.

4. The transmission device according to claim 1, wherein the each of the first plurality of drivers of the first transmitter and the each of the second plurality of drivers of the second transmitter has a resistor, and the each of the first plurality of drivers is configured to turn-on the switch to transmit the first voltage to the output terminal via the resistor, and the each of the second plurality of drivers is configured to turn-on the switch to transmit the fourth voltage to the output terminal via the resistor.

5. The transmission device according to claim 1, wherein the common voltage generator has a plurality of resistors that are provided on a path between a first power source corresponding to the second voltage and a second power source corresponding to the fifth voltage.

6. The transmission device according to claim 1, wherein the common voltage generator includes a voltage regulator that regulates the first voltage and the fourth voltage.

7. The transmission device according to claim 1, wherein the second voltage level is substantially similar to the fifth voltage level.

8. The transmission device according to claim 1, wherein the common voltage generator includes a voltage divider formed by a first number of first circuits and a second number of second circuits, wherein the first number is equal to the second number, and wherein the voltage divider is configured to regulate the first output impedance between the common voltage generator and the first plurality of drivers, and regulate the second output impedance between the common voltage generator and the second plurality of drivers.

9. The transmission device according to claim 1, wherein the first output impedance is approximately 50 Ohms (Ω) between the common voltage generator and the first plurality of drivers, and wherein the second output impedance is approximately 50 Ω between the common voltage generator and the second plurality of drivers.

10. The transmission device according to claim 2, wherein the transmission device has a first operation mode and a second operation mode, and the first driver, the second driver, and the third driver are configured to perform the first operation in the first operation mode.

11. The transmission device according to claim 4, wherein the resistor has a resistance corresponding to a line impedance of a transmission line coupled to the transmission device.

12. The transmission device according to claim 4, wherein the resistor is configured to regulate the output impedance to be substantially the same between the common voltage generator and the each of the first plurality of drivers and between the common voltage generator and the each of the second plurality of drivers.

13. The transmission device according to claim 6, wherein the voltage regulator is configured to regulate the first output impedance between the common voltage generator and the first plurality of drivers, and regulate the second output impedance between the common voltage generator and the second plurality of drivers.

14. The transmission device according to claim 10, wherein the first driver and the second driver are configured to perform a second operation of setting a second set of voltages at the output terminals, each of the second set of voltages being different from each other, and the second set of voltages including the second voltage and the third voltage.

15. The transmission device according to claim 14, wherein the second plurality of drivers of the second transmitter include a fourth driver, a fifth driver, and a sixth driver, the fourth driver, the fifth driver, and the sixth driver are configured to perform the first operation in the first operation mode, the third driver and the fourth driver are configured to perform the second operation in the second operation mode, and the fifth driver and the sixth driver are configured to perform the second operation in the second operation mode.

16. A method comprising:

generating, with a common voltage generator of a transmission device, a first voltage and a fourth voltage, the first voltage and the fourth voltage being substantially similar and sharing a common node;

providing, with the common voltage generator, the first voltage to a first plurality of drivers of the transmission device and the fourth voltage to a second plurality of drivers of the transmission device;

transmitting, with the first plurality of drivers, a first sequence of symbols, each symbol of the first sequence of symbols using a second voltage having a second voltage level, a third voltage having a third voltage level, and the first voltage having a first voltage level that is between the second voltage level and the third voltage level; and transmitting, with the second plurality of drivers, a second sequence of symbols, each symbol of the second sequence of symbols using a fifth voltage having a fifth voltage level, a sixth voltage having a sixth voltage level, and the fourth voltage having a fourth voltage level that is between the fifth voltage level and the sixth voltage level, wherein the common voltage generator has a first output impedance between the common voltage generator and the first plurality of drivers, wherein the common voltage generator has a second output impedance between the common voltage generator and the second plurality of drivers, and wherein the first output impedance matches the second output impedance.

17. A communication system comprising:

a transmission device including a first transmitter including a first plurality of drivers that are configured to transmit a first sequence of symbols, each symbol of the first sequence of symbols using a first voltage having a first voltage level, a second voltage having a second voltage level, and a third voltage having a third voltage level, the first voltage level being between the second voltage level and the third voltage level;

a second transmitter including a second plurality of drivers that are configured to transmit a second sequence of symbols, each symbol of the second sequence of symbols using a fourth voltage having a fourth voltage level, a fifth voltage having a fifth voltage level, and a sixth voltage having a sixth voltage level, the fourth voltage level being between the fifth voltage level and the sixth voltage level; and a common voltage generator electrically connected to the first plurality of drivers and the second plurality of drivers, the common voltage generator configured to generate and provide the first voltage to the first plurality of drivers and the fourth voltage to the second plurality of drivers, wherein each of the first plurality of drivers includes a switch that is configured transmit the first voltage that has been provided by the common voltage generator to an output terminal of the each of the first plurality of drivers, and each of the second plurality of drivers includes a switch that is configured transmit the fourth voltage that has been provided by the common voltage generator to an output terminal of the each of the second plurality of drivers, wherein the first voltage and the fourth voltage are substantially similar and share a common node, the common voltage generator has a first output impedance between the common voltage generator and the first plurality of drivers, the common voltage generator has a second output impedance between the common voltage generator and the second plurality of drivers, and the first output impedance matches the second output impedance; and a reception device communicatively coupled with the transmission device, the reception device including a first receiver configured to receive the first sequence of symbols, and a second receiver configured to receive the second sequence of symbols.

18. The communication system according to claim 17, wherein the first plurality of drivers of the first transmitter include a first driver, a second driver, and a third driver, and the first driver, the second driver, and the third driver are configured to perform a first operation of setting a first set of voltages at output terminals of the first plurality of drivers, each of the first set of voltages being different from each other, and the first set of voltages including the first voltage, the second voltage, and the third voltage.

19. The communication system according to claim 17, wherein each of the first output impedance and the second output impedance corresponds to a line impedance of a transmission line coupled to the transmission device.

20. The communication system according to claim 17, wherein the each of the first plurality of drivers of the first transmitter and the each of the second plurality of drivers of the second transmitter has a resistor, and the each of the first plurality of drivers is configured to turn-on the switch to transmit the first voltage to the output terminal via the resistor, and the each of the second plurality of drivers is configured to turn-on the switch to transmit the fourth voltage to the output terminal via the resistor.

21. The communication system according to claim 18, wherein the transmission device has a first operation mode and a second operation mode, and the first driver, the second driver, and the third driver are configured to perform the first operation in the first operation mode.

22. The communication system according to claim 21, wherein the first driver and the second driver are configured to perform a second operation of setting a second set of voltages at the output terminals, each of the second set of voltages being different from each other, and the second set of voltages including the second voltage and the third voltage.

23. The communication system according to claim 22, wherein the second plurality of drivers of the second transmitter include a fourth driver, a fifth driver, and a sixth driver, the fourth driver, the fifth driver, and the sixth driver are configured to perform the first operation in the first operation mode, the third driver and the fourth driver are configured to perform the second operation in the second operation mode, and the fifth driver and the sixth driver are configured to perform the second operation in the second operation mode.

24. A reception device comprising:

a first receiver configured to receive a first sequence of symbols from a first plurality of drivers of a transmission device, each symbol of the first sequence of symbols using a first voltage having a first voltage level, a second voltage having a second voltage level, and a third voltage having a third voltage level, the first voltage level being between the second voltage level and the third voltage level; and a second receiver configured to receive a second sequence of symbols from a second plurality of drivers of the transmission device, each symbol of the second sequence of symbols using a fourth voltage having a fourth voltage level, a fifth voltage having a fifth voltage level, and a sixth voltage having a sixth voltage level, the fourth voltage being between the fifth voltage level and the sixth voltage level, wherein the first voltage and the fourth voltage are generated and provided by a common voltage generator of the transmission device, and the first voltage and the fourth voltage are substantially similar and share a common node, the common voltage generator has a first output impedance between the common voltage generator and the first plurality of drivers, the common voltage generator has a second output impedance between the common voltage generator and the second plurality of drivers, and the first output impedance matches the second output impedance.

* * * * *